US009624582B2

(12) United States Patent
Shukla

(10) Patent No.: US 9,624,582 B2
(45) Date of Patent: Apr. 18, 2017

(54) NON-AQUEOUS METAL CATALYTIC COMPOSITION WITH OXYAZINIUM PHOTOREDUCING AGENT

(71) Applicant: Deepak Shukla, Webster, NY (US)

(72) Inventor: Deepak Shukla, Webster, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 15/001,322

(22) Filed: Jan. 20, 2016

(65) Prior Publication Data

US 2016/0168717 A1   Jun. 16, 2016

Related U.S. Application Data

(63) Continuation-in-part of application No. 14/571,363, filed on Dec. 16, 2014, now abandoned.

(51) Int. Cl.

| | | |
|---|---|---|
| C23C 18/30 | (2006.01) | |
| B01J 31/06 | (2006.01) | |
| B01J 31/18 | (2006.01) | |
| B01J 35/02 | (2006.01) | |
| C09D 11/52 | (2014.01) | |
| C23C 18/16 | (2006.01) | |
| C23C 18/20 | (2006.01) | |
| H05K 3/18 | (2006.01) | |
| C23C 18/18 | (2006.01) | |
| C23C 18/40 | (2006.01) | |

(52) U.S. Cl.
CPC ............ *C23C 18/30* (2013.01); *B01J 31/06* (2013.01); *B01J 31/181* (2013.01); *B01J 35/026* (2013.01); *C09D 11/52* (2013.01); *C23C 18/1608* (2013.01); *C23C 18/204* (2013.01); *H05K 3/185* (2013.01); *C23C 18/182* (2013.01); *C23C 18/1831* (2013.01); *C23C 18/1868* (2013.01); *C23C 18/1879* (2013.01); *C23C 18/405* (2013.01); *H05K 2203/125* (2013.01)

(58) Field of Classification Search
None
See application file for complete search history.

(56) References Cited

U.S. PATENT DOCUMENTS

| | | | |
|---|---|---|---|
| 5,534,312 | A | 7/1996 | Hill et al. |
| 5,705,661 | A | 1/1998 | Iwakura et al. |
| 7,255,782 | B2 | 8/2007 | Crouse |
| 7,682,774 | B2 | 3/2010 | Kim et al. |
| 7,803,514 | B2 | 9/2010 | Park |
| 7,875,416 | B2 | 1/2011 | Park et al. |
| 8,282,860 | B2 | 10/2012 | Chung et al. |
| 2007/0080345 | A1 | 4/2007 | Joo et al. |
| 2007/0261595 | A1 | 11/2007 | Johnson et al. |
| 2011/0111138 | A1 | 5/2011 | McCullough et al. |
| 2012/0122664 | A1* | 5/2012 | Shukla ............... C08F 2/50 502/167 |
| 2012/0207945 | A1* | 8/2012 | Shukla ............... C08K 5/527 427/532 |

FOREIGN PATENT DOCUMENTS

| | | | |
|---|---|---|---|
| JP | 08-311373 | * | 11/1996 |
| JP | 2010-239080 | * | 10/2010 |
| WO | 2013/063183 | | 5/2013 |
| WO | 2013/169345 | | 11/2013 |

OTHER PUBLICATIONS

Hong-Ki Kim, et al., "Syntheses of Liquid Phase [(efac)Ag(P(OR)$_3$)] Precursors and Their Application to the Preparation of Silver and Silver Selenide Thin Films," *Bull. Korean Chem. Soc.* 2004, vol. 25, No. 7, pp. 1068-1070.
Koen Binnemans, et al., "Structure and Mesomorphism of Silver Alkanoates," *Chem. Mater.* 2004, 16, 2021-2027, pp. 2021-2027.
Lin Song et al., "[(CO)$_3$(PPh$_3$)$_2$OsAg(O$_2$CCF$_3$)]: A Model for an Intermediate on the Reaction Coordinate in Electron Transfer," *Angew. Chem. Int. Ed. Engl.* 31 (1992) No. 6, pp. 770-772.
Yosi Shacham-Diamand, et al. "Electroless Silver and Silver with Tungsten Thin Films for Microelectronics and Microelectromechanical System Applications," *Journal of the Electrochemical Society*, 147 (9) pp. 3345-3349 (2000).
Alexander Jakob, et al., "Phosphane/phosphate silver(I) carboxylates as CVD precursors," *Microchimica Acta* 156, pp. 77-81 (2007).
M. Molina, "Interaction of ion silver(I) with pyridines," *J. inorg. Nucl. Chem.*, 1972, vol. 34, pp. 2985-2987.
Nikolay Gerasimchuk, "Synthesis, Properties, and Applications of Light-Insensitive Silver(I) Cyanoximates," *Eur. J. Inorg. Chem.* 2014, pp. 4518-4531.
Andrei N. Khlobystov, et al., "Supramolecular design of one-dimensional coordination polymers based on silver(I) complexes of aromatic nitrogen-donor ligands," *Coordination Chemistry Reviews*, 222 (2001) pp. 155-192.

(Continued)

*Primary Examiner* — Yun Qian
(74) *Attorney, Agent, or Firm* — J. Lanny Tucker

(57) ABSTRACT

A non-aqueous metal catalytic composition includes (a) a silver complex comprising reducible silver ions, (b) an oxyazinium salt silver ion photoreducing agent, (c) a hindered pyridine, (d) a photocurable component, a non-curable polymer, or combination of a photocurable component and a non-curable polymer, and (e) a photo sensitizer different from all components (a) through (d) in the non-aqueous metal catalytic composition, in an amount of at least 1 weight %. This non-aqueous metal catalytic composition can be used to form silver metal particles in situ during suitable reducing conditions. The silver metal can be provided in a suitable layer or pattern on a substrate, which can then be subsequently subjected to electroless plating to form electrically-conductive layers or patterns for use in various articles or as touch screen displays in electronic devices.

10 Claims, 1 Drawing Sheet

(56) References Cited

OTHER PUBLICATIONS

Yue Zhao, et al., "Silver(I) complexes with oxazoline-containing bidentate ligands: Syntheses, structures and properties," *Inorganica Chimica Acta* 392 (2012) pp. 38-45.
Chih Yuen Chen, et al., "Argentophilic interaction and anionic control of supramolecular structures in simple silver pyridine compleses," *Inorganica Chimica Acta* 360 (2007) pp. 21-30.
Marc Madou, et al., "From Batch to Continuous Manufacturing of Microbiomedical Devices," *Chem. Rev.* 2000, 100, pp. 2679-2692.
Edward Sztyk, et al., "CVD of $Ag^I$ Complexes with Tertiary Phosphines and Perfluorinated Carboxylates—A New Class of Silver Precursors," *Chem Vap. Deposition* 2001, 7, No. 3, pp. 111-116.
C. Oldham, "Complexes of Simple Carboxylic Acids," *Prog. Inorg. Chem.* 10, pp. 223-258, 1968.

\* cited by examiner

NON-AQUEOUS METAL CATALYTIC COMPOSITION WITH OXYAZINIUM PHOTOREDUCING AGENT

RELATED APPLICATIONS

This application is a continuation-in-part of U.S. patent application Ser. No. 14/571,363, filed Dec. 16, 2014 (now abandoned), which is hereby incorporated herein by reference in its entirety.

Reference is made to the following copending and commonly assigned patent applications, the disclosures of all of which are incorporated herein by reference:

U.S. Ser. No. 14/571,354, filed on Dec. 16, 2014, by Shukla and Donovan, entitled "Forming Catalytic Sites from Reducible Silver Complexes";

U.S. Ser. No. 14/572,375, filed on Dec. 16, 2014, by Shukla and Donovan, entitled "Forming Silver Catalytic Sites from Silver-Phosphite Carboxylates";

U.S. Ser. No. 14/571,410, filed on Dec. 16, 2014, by Shukla and Donovan, entitled "Forming Silver Catalytic Sites from Reducible Silver-Oximes";

U.S. Ser. No. 14/571,439, filed on Dec. 16, 2014, by Shukla and Donovan, entitled "Forming Catalytic Sites from Reducible Silver-Heterocyclic Complexes";

U.S. Ser. No. 14/571,393, filed on Dec. 16, 2014, by Shukla, entitled "Non-aqueous Metal Catalytic Composition with Silver Carboxylate-Trialkyl(Triaryl)phosphite Complex";

U.S. Ser. No. 14/571,419, filed on Dec. 16, 2014, by Shukla, entitled "Non-aqueous Metal Catalytic Composition with Silver-Oxime Complex"; and U.S. Ser. No. 14/571,462, filed on Dec. 16, 2014, by Shukla, entitled "Non-aqueous Metal Catalytic Composition with Silver N-Heterocycle Complex".

FIELD OF THE INVENTION

This invention relates to a non-aqueous metal catalytic composition that can be used in a method for forming silver particles in-situ from reducible silver ions that are provided from a coating or pattern. The non-aqueous metal catalytic composition contains a silver complex containing reducible silver ions, oxyazinium salt silver ion photoreducing composition, hindered pyridine, photocurable component or non-curable polymer, and photosensitizer. The resulting silver particles in the layer or coating can be used directly as electrically-conductive materials or as "seed" catalytic sites for electroless plating of a suitable electrically-conductive metal.

BACKGROUND OF THE INVENTION

Rapid advances are occurring in various electronic devices especially display devices that are used for various communicational, financial, and archival purposes. For such uses as touch screen panels, electrochromic devices, light emitting diodes, field effect transistors, and liquid crystal displays, conductive films are essential and considerable efforts are being made in the industry to improve the properties of those conductive films.

There is a particular need to provide touch screen displays and devices that contain improved conductive film elements. Currently, touch screen displays use Indium Tin Oxide (ITO) coatings to create arrays of capacitive areas used to distinguish multiple point contacts. ITO coatings have significant short comings. Indium is an expensive rare earth metal and is available in limited supply from very few sources in the world. ITO conductivity is relatively low and requires short line lengths to achieve adequate response rates. Touch screens for large displays are broken up into smaller segments to reduce the conductive line length to an acceptable resistance. These smaller segments require additional driving and sensing electronics. In addition ITO is a ceramic material, is not readily bent or flexed, and requires vacuum deposition with high processing temperatures to prepare the conductive layers.

Silver is an ideal conductor having conductivity 50 to 100 times greater than ITO. Silver is used in many commercial applications and is available from numerous sources. It is highly desirable to make conductive film elements using silver as the source of conductivity.

Numerous publications describe the preparation of electrically-conductive films formed by reducing a silver halide image in silver halide emulsions in the form of electrically-conductive grid networks having silver wires having sizes of less than 10 μm. Various efforts have been made to design the silver halide emulsions and processing conditions to optimize such electrically-conductive grid networks and the methods for making them.

For example, improvements have been proposed for providing electrically-conductive grid patterns from silver halides by optimizing the silver halide emulsions as well as finding optimized processing solutions and conditions to convert latent silver images into silver metal grid patterns. The precursors used to provide the conductive films can comprise one or more silver halide emulsion layers on opposing sides of a transparent substrate, along with optional filter layers and hydrophilic overcoats.

While these processes and articles can provide desired electrically-conductive films, optimizing the design of both the precursors and processing procedures requires considerable effort in order to achieve the exacting features required in electrically-conductive films to be incorporated into touch screen displays.

Other industrial approaches to preparing electrically-conductive films or elements have been directed to formulating and applying photocurable compositions containing dispersions of metal particles such as silver metal particles to substrates, followed by curing of the photocurable components in the photocurable compositions. The applied silver particles thus act as catalytic (seed) particles for electrolessly plated electrically-conductive metals. Useful electrically-conductive grids prepared in this manner are described for example in WO 2013/063183 (Petcavich), WO 2013/169345 (Ramakrishnan et al.). Other details of a useful manufacturing system for preparing conductive articles especially in a roll-to-roll manner are provided in PCT/US/062366 (filed Oct. 29, 2012 by Petcavich and Jin).

Using these methods, photocurable compositions containing silver particles can be printed and cured on a suitable transparent substrate for example a continuous roll of a transparent polyester, and then electroless plating can be carried out. These methods require that high quantities of silver particles be dispersed within the photocurable compositions in a uniform manner so that coatings or printed patterns have sufficiently high concentration of catalytic sites. This generally cannot be achieved without carefully designed dispersants and dispersing procedures and such dispersants can be expensive and hard to use in a manner to provide reproducible products in a high speed manufacturing operation. Without effective dispersing, silver particles can readily agglomerate, leading to less effective and uniform application of catalytic metal patterns and electroless plating. It is therefore difficult to provide uniform electrically-conductive films having the desired electrically-conductive metal patterns.

U.S. Patent Application Publication 2007/0261595 (Johnson et al.) describes a method for electroless deposition on a substrate that uses an ink composition containing silver as a reducible silver salt and filler particles. After reducing the reducible silver ions, such compositions can be cured for improved adhesion to the substrate especially if the compositions contain an UV-curable monomer or oligomer.

U.S. Pat. No. 7,875,416 (Park et al.) describes photosensitive compositions comprising a multifunctional epoxy resin, a photoacid generator, an organic solvent, and silver particles.

A common coordinating ion to form organic silver complexes is carboxylic acid [*Prog. Inorg. Chem.*, 10, 233 (1968)]. However, silver-carboxylate complexes are generally sensitive to light and hardly soluble in organic solvents [U.S. Pat. No. 5,491,059 of Whitcomb and U.S. Pat. No. 5,534,312 of Hill et al.] and have a high decomposition temperature. Thus, such complexes have little utility in spite of ready availability. To solve this problem, several methods have been proposed for example, in *Ang. Chem., Int. Ed. Engl.*, 31, p. 770 (1992), *Chem. Vapor Deposition*, 7, 111 (2001), *Chem. Mater.*, 16, 2021 (2004), and U.S. Pat. No. 5,705,661 (Iwakura et al.). Among such methods are those using carboxylic acid compounds having long alkyl chains or including amine compounds or phosphine compounds. However, the silver derivatives known thus far are limited and have insufficient stability or solubility. Moreover, they have a high decomposition temperature needed to be useful for pattern formation and are decomposed slowly.

U.S. Pat. No. 7,682,774 (Kim et al.) describes other photosensitive compositions comprising silver fluoride organic complex precursors as catalyst precursors. This patent describes the use of polymer derived from a monomer having a carboxyl group and a co-polymerizable monomer that may provide polymeric stability and developability of the resulting "seed" silver catalyst particles used for electroless plating.

Despite the various techniques described in the art, there remains a need for an improved means for providing silver catalytic (seed) particles for electroless plating in the formation of electrically-conductive patterns in a reproducible and high-speed manner suitable for continuous high-speed production. It is particularly desirable to provide a method for high-speed production of electrically-conductive patterns without the need for complicated and uncertain dispersing procedures for high concentrations of silver metal particles.

SUMMARY OF THE INVENTION

The present invention provides a non-aqueous metal catalytic composition comprising:

(a) a silver complex comprising reducible silver ions, in an amount of at least 2 weight %, (b) an oxyazinium salt silver ion photoreducing agent in an amount of at least 2 weight %, (c) a hindered pyridine in an amount of at least 5 weight %, (d) a photocurable component, non-curable polymer, or combination of a photocurable component and a non-curable polymer, and (e) a photosensitizer different from all components (a) through (d) in the non-aqueous metal catalytic composition, in an amount of at least 1 weight %, all amounts being based on the total amount of components (a) through (e) in the non-aqueous metal catalytic composition.

The advantage of the present invention is to provide a source of silver particles that can be used as electrically-conductive silver metal or catalytic (seed) sites for electroplating without having to disperse silver particles in various photocurable compositions. The present invention avoids the need to carefully disperse silver particles and potential agglomeration in coating or printing compositions ("inks") by "creating" or generating the silver particles in-situ as seed catalysts after a photocurable composition has been coated or printed. Thus, the silver particles are generated in situ from reducible silver ions that can be provided in silver complexes in coated or printed non-aqueous metal catalytic compositions. Using this means for producing silver metal particles reduces possible operator errors during dispersing processes and reduces defects in producing electrically-conductive patterns. These advantages are particularly useful in high-speed manufacturing operations such as roll-to-roll methods in which the application, curing, and electroless plating can be carried out in a continuous manner.

Thus, important differences between the present invention and what is known in the art include at least the following:

1) A number of silver containing complexes are known but where formulations are to be designed with high concentrations of pre-formed silver particles, such as loaded pastes and inks, the formulations become highly complex in order to make them stable as dispersions of the silver particles. The present invention avoids this problem by enabling the formation of high concentrations of silver particles for various photocurable compositions.

2) Photochemical methods used to generate silver nanoparticles use silver nitrate and methyl diethanolamine that are starting materials that show poor stability (that is, the silver ions are reduced thermally) and cause gelling of polymerizable monomers by the silver ions. The present invention avoids this problem by forming silver particles in situ and avoids the use of unstable reactants.

3) Known photochemical methods used to generate silver nanoparticles have little practical utility as they use silver nitrate as a starting material and this salt exhibits poor shelf keeping or dark stability. The present invention avoids this problem by using silver complexes and photocurable compositions that are light stable precursors for photogenerating silver particles in thin films or other useful formats.

4) Other known photochemical methods used to generate silver nanoparticles use silver fluoride organic complex precursors as catalyst precursors. For example, U.S. Pat. No. 7,682,774 (noted above) describes the use of a carboxyl group containing polymer that has an acid value of from 90 to 700 mg KOH/g. The described process additionally requires first a heating at 100° C., reduction of the silver fluoride complex, and then electroless plating. The present invention provides a much simpler process and is not restricted to carboxyl-containing polymers and oligomers that exhibit various problems described above.

5) Known compositions containing silver nanoparticles generally contain ligands or dispersing agent that provide only stabilization or solubilization of the particles. The present invention avoids this by providing stabilized silver complexes in photocurable compositions that provide an easy way to generate silver particles without the need for separate stabilizing ligands or dispersing agents.

DETAILED DESCRIPTION OF THE INVENTION

Figure 1:
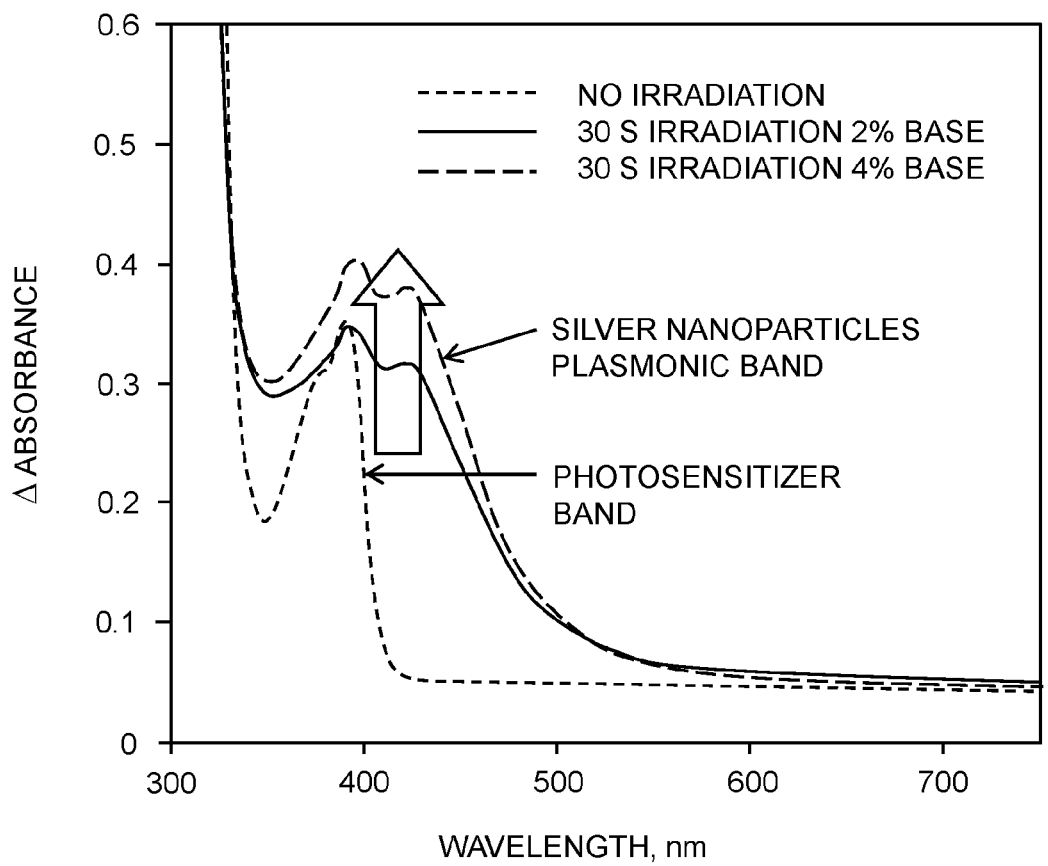
FIG. 1 shows absorption spectra showing silver plasmon band formation upon in situ photogeneration of silver nanoparticles using the silver complex prepared in Invention Example 1 below.

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described with the discussion of any one embodiment.

DEFINITIONS

As used herein to define the components of the various non-aqueous metal catalytic compositions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary or have customary or commonly understood meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a non-aqueous metal catalytic composition, formulation, solution, or the percent of the dry weight of a metal catalytic layer or metal catalytic pattern. Unless otherwise indicated, the percentages can be the same for either a dry metal catalytic layer or metal catalytic pattern, or for the total solids of the formulation or non-aqueous metal catalytic composition used to make that metal catalytic layer or metal catalytic pattern.

As used herein, the terms "curing" and "photocuring" mean the polymerization of functional oligomers and monomers, or even polymers, into a crosslinked polymer network as initiated by suitable irradiation. Curing can be polymerization of unsaturated monomers or oligomers as photocurable components in the presence of crosslinking agents.

The photocurable components can be photocured when irradiated with suitable radiation, for example ultraviolet (UV) or visible radiation having a wavelength of at least 150 nm and up to and including 750 nm.

Unless otherwise indicated, the terms "non-aqueous metal catalytic composition" and "metal catalytic composition" are considered to be the same.

Unless otherwise indicated, the term "non-aqueous" as applied to the metal catalytic composition means that liquids in such compositions are predominantly organic solvents and water is not purposely added and may be present in an amount of less than 10 weight %, or particular of less than 5 weight %, or even less than 1 weight %, of the total non-aqueous metal catalytic composition weight. In most instances, the presence of water can adversely affect the silver complexes used in the present invention.

Average dry thickness of metal catalytic layers or metal catalytic patterns described herein can be the average of at least 2 separate measurements taken, for example, using electron microscopy.

Similarly, the average dry thickness or width of lines, grid lines, or other pattern features described herein can be the average of at least 2 separate measurements taken, for example, using electron microscopy.

Unless otherwise indicated, the term "group" particularly when used to define a substituent of a define moiety, can itself be substituted or unsubstituted (for example and alkyl group" refers to a substituted or unsubstituted alkyl). Generally, unless otherwise specifically stated, substituents on any "groups" referenced herein or where something is stated to be possibly substituted, include the possibility of any groups, whether substituted or unsubstituted, which do not destroy properties necessary for the utility of the component or non-aqueous metal catalytic composition. It will also be understood for this disclosure and claims that reference to a compound of a particular general structure includes those compounds of other more specific formula that fall within the general structural definition. Examples of substituents on any of the mentioned groups can include known substituents such as: halogen (for example, chloro, fluoro, bromo, and iodo); alkoxy particularly those with 1 to 12 carbon atoms (for example, methoxy and ethoxy); substituted or unsubstituted alkyl groups, particularly lower alkyl groups (for example, methyl and trifluoromethyl); alkenyl or thioalkyl (for example, methylthio and ethylthio), particularly either of those with 1 to 12 carbon atoms; substituted and unsubstituted aryl, particularly those having from 6 to 20 carbon atoms in the aromatic ring (for example, phenyl); and substituted or unsubstituted heteroaryl, particularly those having a 5- or 6-membered ring containing 1 to 3 heteroatoms selected from N, O, S or Se (for example, pyridyl, thienyl, furyl, pyrrolyl, and their corresponding benzo and naptho analogs); and other substituents that would be readily apparent in the art. Alkyl substituents particularly contain 1 to 12 carbon atoms and specifically include "lower alkyl" that is having from 1 to 6 carbon atoms, for example, methyl, ethyl, and t-butyl. Further, with regard to any alkyl group, alkylene group or alkenyl group, it will be understood that these can be branched or unbranched and include ring (cyclic) structures.

Uses

The non-aqueous metal catalytic compositions can be used for a variety of purposes where efficient photocuring or photopolymerization is needed in various articles or devices. Such non-aqueous metal catalytic compositions are sensitive to a chosen radiation wavelength as noted above. For example, the non-aqueous metal catalytic compositions can be used to provide electrically-conductive metal patterns, for example using electroless plating procedures that can be incorporated into various devices including but not limited to touch screen or other transparent display devices that can be used in numerous industrial and commercial products.

For example, touch screen technology can comprise different touch sensor configurations including capacitive and resistive touch sensors. Resistive touch sensors comprise several layers that face each other with a gap between adjacent layers that may be preserved by spacers formed during manufacturing. A resistive touch screen panel can comprise several layers including two thin, metallic, electrically-conductive layers separated by a gap that can be created by spacers. When an object such as a stylus, palm, or fingertip presses down on a point on the panel's outer surface, the two metallic layers come into contact and a connection is formed that causes a change in the electrical current. This touch event is sent to a controller for further processing.

Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process where micro electrically-conductive features can be created in a single pass are possible using the present invention. The non-aqueous metal catalytic compositions can be used in such systems and methods by application with printing members such as flexographic printing plates. Multiple patterns of non-aqueous metal catalytic compositions can be printed on one or both sides of a substrate as described in more details below. For example, one predetermined pattern can be printed on one side of the substrate and a different predetermined pattern can be printed on the opposing side of the substrate. The printed patterns of the non-aqueous metal catalytic compositions can then be further processed to provide electrically-conductive metal patterns such as for example using electroless metal plating.

Non-Aqueous Metal Catalytic Compositions

In general, the non-aqueous metal catalytic compositions of this invention are sensitive throughout the UV to visible spectral region as described above and are photocurable without appreciable application of heat. Thus, photocuring can occur at essentially room temperature (for example, as low as 18° C.) when all of the components of the non-aqueous metal catalytic compositions are properly mixed together. The non-aqueous metal catalytic compositions are designed to be effective when they comprise the essential components (a) through (e) described herein, which are the only components necessary to achieve the desired efficient photocuring. Optional addenda can also be included as described below. However, no organic phosphites are purposely added to the non-aqueous metal catalytic compositions of this invention.

The non-aqueous metal catalytic composition useful in this invention comprises essential components (a) through (e) and any optional components as described below in the described amounts, but no organic phosphites.

The essential component (a) is a silver complex comprising reducible silver ions, which complexes can be comprised of any suitable organic or inorganic moiety (or combination of moieties). Such silver complexes can be mononuclear, dinuclear, trinuclear, or higher. The silver complex generally has a net neutral charge.

Some particularly useful silver complexes include but are not limited to, silver nitrate, silver acetate, silver benzoate, silver nitrite, silver oxide, silver sulfate, silver thiocyanate, silver carbonate, silver myristate, silver citrate, silver phenylacetate, silver malonate, silver succinate, silver adipate, silver phosphate, silver perchlorate, silver tetrafluoroborate, silver acetylacetonate, silver lactate, silver oxalate, silver 2-phenylpyridine, and derivatives thereof. Other useful silver complexes include silver fluoride complexes such as silver (I) fluorosulfate, silver (I) trifluoroacetate, silver (I) trifluoromethane sulfate, silver (I) pentafluoropropionate, and silver (I) heptafluorobutyrate; β-carbonyl ketone silver (I) complexes; and silver proteins.

Useful silver complexes can be readily prepared using known procedures and some can be purchased from commercial sources.

The noted silver complex (or combination thereof) is generally present in the non-aqueous metal catalytic composition in an amount of at least 2 weight %, and more typically in an amount of at least 2 weight % and up to and including 90 weight %, or even at least 10 weight % and up to and including 25 weight %, all based on the total essential components (a) through (e) in the non-aqueous metal catalytic composition.

The non-aqueous metal catalytic composition also comprises an oxyazinium salt silver ion photoreducing agent as a second essential component (b). Such compounds are present in order to reduce the reducible silver ions that are present in the silver complex described above.

The useful oxyazinium salts are N-oxy-N-heterocyclic compounds having a heterocyclic nucleus (for example, N-oxyazinium salts), such as a pyridinium, diazinium, or triazinium nucleus, or other similar nuclei that would be readily apparent to one skilled in the art. The oxyazinium salt can include one or more aromatic rings, typically carbocyclic aromatic rings, fused with the N-oxy-N-heterocyclic compound, including quinolinium, isoquinolinium, benzodiazinium, phenanthridium, and naphthodiazinium. Any convenient charge balancing counter-ion can be employed to complete the oxyazinium salt photoinitiators, such as halide, fluoroborate, hexafluoro-phosphate, toluene sulfonate, and others that would be readily apparent to one skilled in the art. The oxy group ($-O-R_1$) within the oxyazinium salt which quaternizes the ring nitrogen atom of the azinium nucleus can be selected from among a variety of synthetically convenient oxy groups. The oxyazinium salt can also be an oligomeric or polymeric compound.

The oxyazinium salt can have a reduction potential less negative than −1.4 V and comprise an N-oxy group that is capable of releasing an oxy radical during irradiation of the non-aqueous metal catalytic composition.

Representative oxyazinium salt silver ion photoreducing agents can be represented by the following Structure (I):

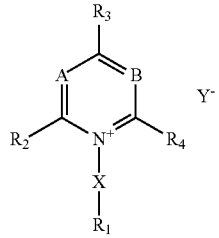
(I)

wherein A and B in Structure (I) independently represent a carbon, C—$R_5$, C—$R_6$, or nitrogen, and X is oxygen (O).

$R_1$, $R_2$, $R_3$, $R_4$, $R_5$, and $R_6$ are independently hydrogen, or substituted or unsubstituted alkyl groups having 1 to 12 carbon atoms or substituted or unsubstituted aryl groups having 6 or 10 carbon atoms in the carbocyclic ring, which groups can be substituted with one or more aryloxy, alkoxy, aryloxy, alkylthio, arylthio, alkylsulfonyl, thiocyano, cyano, halogen, alkoxycarbonyl, aryloxycarbonyl, acetal, aroyl, alkylaminocarbonyl, arylaminocarbonyl, alkylaminocarbonyloxy, arylaminocarbonyloxy, acylamino, amino, alkylamino, acylamino, carboxy, sulfo, trihalomethyl, alkyl, aryl, heteroaryl, alkylureido, arylureido, succinimido, phthalimido groups, —CO—$R_7$ wherein $R_7$ is a substituted or unsubstituted alkyl or a substituted or unsubstituted aryl group, or —(CH=CH)$_m$—$R_8$ wherein $R_8$ is a substituted or unsubstituted aryl group or a substituted or unsubstituted heterocyclic group.

Any of the A, B, and noted R groups in Structure (I), where chemically feasible, can be joined together to form a ring. $Y^-$ is a suitable charge balancing anion that can be a separate charged moiety or a charged part of an A, B, or R group.

Other useful oxyazinium salts are represented by the following Structure (II):

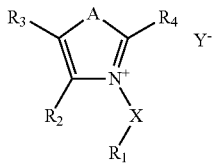
(II)

wherein A in Structure (II) represents carbon, C—$R_5$, nitrogen, sulfur, or oxygen with sufficient bonds and substituents to form a heteroaromatic ring, and X is oxygen (O). $R_1$, $R_2$, $R_3$, $R_4$, and $R_5$ are independently hydrogen, or substituted or unsubstituted alkyl or aryl groups as described above for Structure (I), or any two R groups can be joined together to form a ring. $Y^-$ is a charge balancing anion that can be a separate charged moiety or part of a charged R group.

In some embodiments of Structures (I) and (II), $R_1$ is a substituted or unsubstituted alkyl group having 1 to 18 carbon atoms or a substituted or unsubstituted aryl group having 6 or 10 carbon atoms in the aromatic ring.

Other useful N-oxyazinium salt photoinitiators having a cation can be represented by the following formulae:

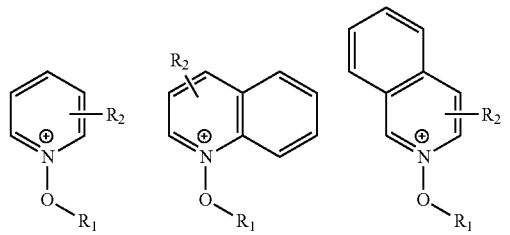

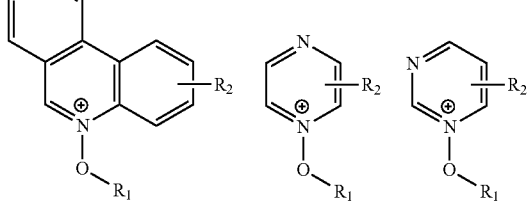

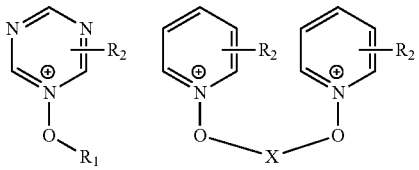

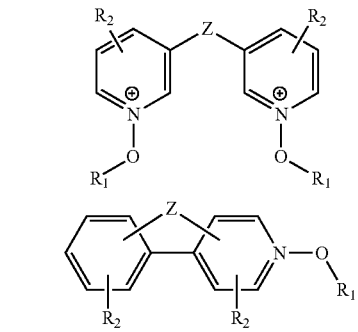

wherein $R_1$ represents a substituted or unsubstituted alkyl group, substituted or unsubstituted aryl group, or an acyl group, as described above, and wherein $R_1$ can also include a charge balancing anion, the $R_2$ groups independently represent hydrogen, or substituted or unsubstituted alkyl, substituted or unsubstituted aryl, substituted or unsubstituted alkoxy, or substituted or unsubstituted heteroaryl groups. The $R_2$ groups can also be nitrile groups. X is a divalent linking group and Z is a substituted or unsubstituted aliphatic linking group having 1 to 12 atoms in the linking chain.

Other useful N-oxyazinium salt photoinitiators are illustrated by Structures III and IV and the compounds shown in TABLES 1 and 2 of U.S. Pat. No. 7,632,879 (Majumdar et al.) the disclosure of which is incorporated herein by reference for the teaching of these compounds.

Particularly useful oxyazinium salt silver ion photoreducing agents are compounds OZ-1 through OZ-16 identified below in TABLE I.

TABLE I
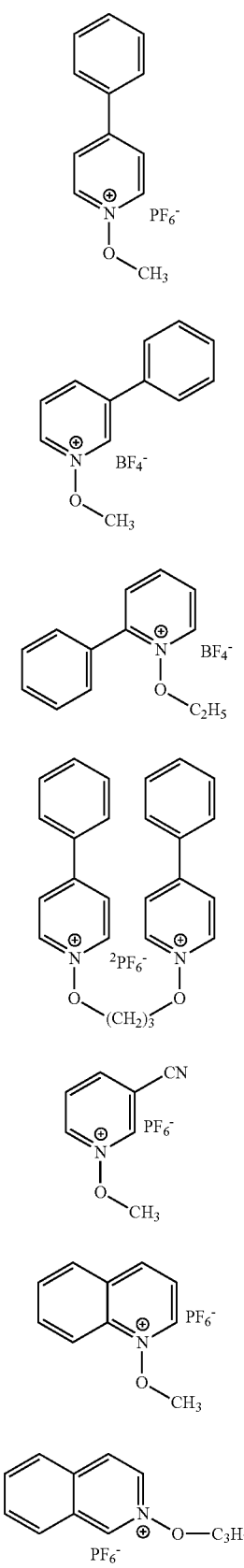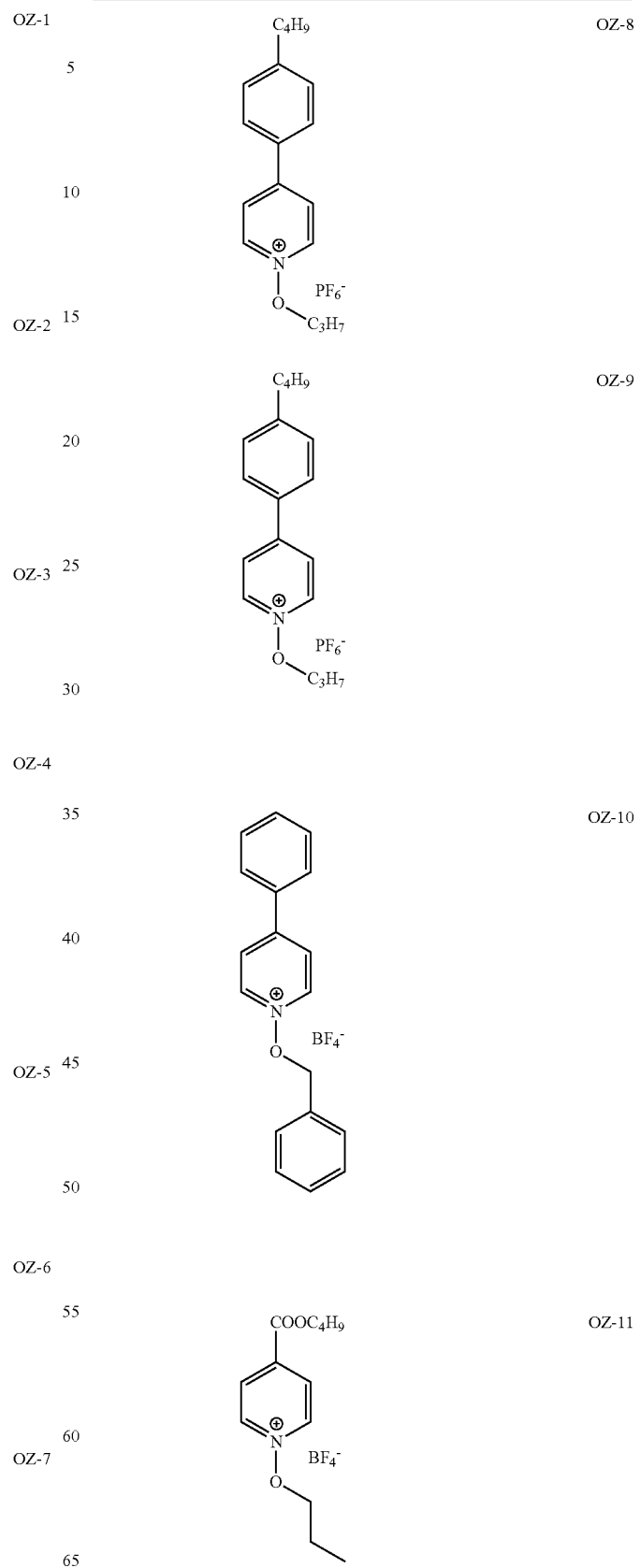

TABLE I-continued

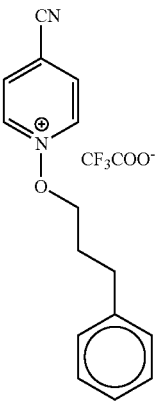
OZ-12

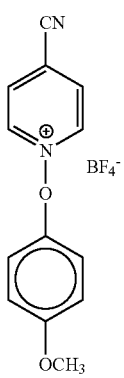
OZ-13

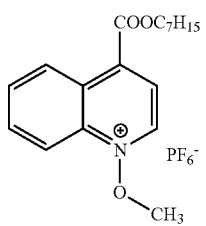
OZ-14

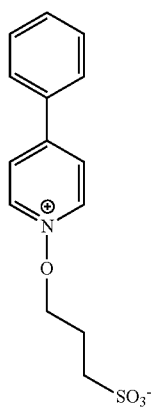
OZ-15

TABLE I-continued

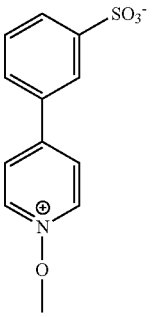
OZ-16

Mixtures of oxyazinium salts can be used if desired, and the total amount of oxyazinium salt silver ion photoreducing agents in the non-aqueous metal catalytic compositions described herein invention is generally at least 2 weight % and up to and including 25 weight % or up to and including 10 weight % based on the total amount of essential components (a) through (e) in the non-aqueous metal catalytic composition.

Essential component (c) in the non-aqueous metal catalytic composition is a hindered pyridine compound that is has substituent alkyl or aryl groups in the ortho positions of the pyridine ring. The alkyl substituents can be substituted or unsubstituted and linear, branched or cyclic in structure and generally comprise 1 to 18 carbon atoms, and the aryl substituents can be substituted or unsubstituted phenyl or naphthyl groups. Such hindered pyridine compounds are generally weaker bases than meta- and para-substituted pyridine compounds [for example, see *J. Org. Chem.* 33, 1922 (1968)]. Useful examples of such compounds include but are not limited to, 2,6-dimethylpyridine, 2-t-butylpyridine, 2-phenylpyridine, and other compounds that would be readily apparent to one skilled in the art, and 2,6-dimethylpyridine is particularly useful.

Such hindered pyridine compounds are present in the non-aqueous metal catalytic composition in an amount of at least 5 weight % and up to and including 20 weight %, or particularly of at least 5 weight % and up to and including 10 weight %, all based on the total amount of essential components (a) through (e) in the non-aqueous metal catalytic composition.

In addition, the non-aqueous metal catalytic composition comprises essential component (d) that comprises one or more photocurable components, one or more non-curable polymers, or a combination of one or more photocurable components and one or more non-curable polymers.

Overall, the one or more photocurable components, the one or more non-curable polymers, or combination thereof can be present in the non-aqueous metal catalytic composition in an amount of at least 10 weight % and up to and including 88 weight %, and typically at least 10 weight % and up to and including 50 weight %, all based on the total amount of essential components (a) through (e) in the non-aqueous metal catalytic composition. The amounts of each type of component (d) can be adjusted depending upon what the component is designed to do and useful amounts of specific photocurable components and non-curable polymers are described below. The amounts can also be adjusted when there are multiple materials comprising the photocurable components, such as photocurable monomers, oligomers, or polymers as well as any free radical photoinitiators that may be needed with such materials.

The useful photocurable components are considered materials that can participate in a photocuring reaction, for example as a photocurable monomer, oligomer, or polymer or as a photoinitiator or co-initiator. Such photocurable components can be designed to participate in either free radical photocuring in which free radicals are generated upon photoexposure, or in acid-catalyzed photocuring in which an acid is generated for reaction and curing of an epoxy compound.

In general, the photocurable components are sensitive throughout the UV to visible spectral region as described above and are photocurable or cause photocuring in these electromagnetic regions without appreciable application of heat. Thus, photocuring or photopolymerization can occur at essentially room temperature (for example, as low as 18° C.) when all of the components are properly mixed together.

Examples of photocurable components that participate in acid-catalyzed photocuring including photopolymerizable epoxy materials that are organic compounds having at least one oxirane ring that is polymerizable by a ring opening mechanism. Such epoxy materials, also called "epoxides", include monomeric epoxy compounds and epoxides of the polymeric type and can be aliphatic, cycloaliphatic, aromatic or heterocyclic. These materials generally have, on the average, at least one polymerizable epoxy group per molecule, or typically at least about 1.5 and even at least about 2 polymerizable epoxy groups per molecule. Polymeric epoxy materials include linear polymers having terminal epoxy groups (for example, a diglycidyl ether of a polyoxyalkylene glycol), polymers having skeletal (backbone) oxirane units (for example, polybutadiene polyepoxide), and polymers having pendant epoxy groups (for example, a glycidyl methacrylate polymer or copolymer).

The polymerizable epoxy materials can be single compounds or they can be mixtures of different epoxy materials containing one, two, or more epoxy groups per molecule. The "average" number of epoxy groups per molecule is determined by dividing the total number of epoxy groups in the epoxy material by the total number of epoxy-containing molecules present.

The epoxy materials can vary from low molecular weight monomeric materials to high molecular weight polymers and they can vary greatly in the nature of the backbone and substituent (or pendant) groups. For example, the backbone can be of any type and substituent groups thereon can be any group that does not substantially interfere with cationic photocuring process desired at room temperature. Illustrative of permissible substituent groups include but are not limited to, halogens, ester groups, ethers, sulfonate groups, siloxane groups, nitro groups, and phosphate groups. The molecular weight of the epoxy materials can be at least 58 and up to and including 100,000, or even higher.

Specific useful epoxy materials would be readily apparent to one skilled in the art. Many commercially available epoxy materials are useful in the present invention, glycidyl ethers such as bisphenol-A-diglycidyl ether (DGEBA), glycidyl ethers of bisphenol S and bisphenol F, butanediol diglycidyl ether, bisphenol-A-extended glycidyl ethers, phenol-formaldehyde glycidyl ethers (epoxy novolacs) and cresol-formaldehyde glycidyl ethers (epoxy cresol novolacs), epoxidized alkenes such as 1,2-epoxyoctane, 1,2,13,14-tetradecane diepoxide, 1,2,7,8-octane diepoxide, octadecylene oxide, epichlorohydrin, styrene oxide, vinyl cyclohexene oxicyclohexene oxide, glycidol, glycidyl methacrylate, diglycidyl ether of Bisphenol A (for example, those available under the EPON trademark such as EPON™ 828, EPON™ 825, EPON™ 1004, and EPON™ 1010 from Momentive, DER-331, DER-332, and DER-334 resins from Dow Chemical Co.), vinyl cyclohexene dioxide (for example, ERL-4206 resin from Polyscience), 3,4-epoxycyclohexylmethyl-3,4-epoxycyclohexene carboxylate (for example, ERL-4221, UVR 6110, or UVR 6105 resin from Dow Chemical Company), 3,4-epoxy-6-methylcyclohexyl-methyl-3,4-epoxy-6-methyl-cyclohexene carboxylate (from Pfalz and Bauer), bis(3,4-epoxy-6-methylcyclohexylmethyl) adipate, bis(2,3-epoxy-cyclopentyl) ether, aliphatic epoxy modified with polypropylene glycol, dipentene dioxide, epoxidized polybutadiene (for example, Oxiron 2001 resin from FMC Corp.), silicone resin containing epoxy functionality, flame retardant epoxy resins (for example, DER-580 resin, a brominated bisphenol type epoxy resin available from Dow Chemical Co.), 1,4-butanediol diglycidyl ether of phenol formaldehyde novolak (for example, DEN-431 and DEN-438 resins from Dow Chemical Co.), resorcinol diglycidyl ether (for example, CYRACURE™ resin from Dow Corning Corp.), 2-(3,4-epoxycyclohexyl-5,5-spiro-3,4-epoxy)cyclohexane-meta-dioxane, 2-(3,4-epoxycyclohexyl-5,5-spiro-3,4-epoxy)cyclohexane-meta-dioxane, vinyl cyclohexene monoxide, 1,2-epoxyhexadecane (for example, CYRACURE™ resin from Dow Corning Corp.), alkyl glycidyl ethers such as HELOXY™ Modifier 7 and HELOXY™ Modifier 8 (from Momentive), butyl glycidyl ether (for example, HELOXY™ Modifier 61 from Momentive), cresyl glycidyl ether (for example, HELOXY™ Modifier 62 from Momentive), p-tert butyl-phenyl glycidyl ether (for example, HELOXY™ Modifier 65 from Momentive), polyfunctional glycidyl ethers such as diglycidyl ether of 1,4-butanediol (for example, HELOXY™ Modifier 67 from Momentive), diglycidyl ether of neopentyl glycol (for example, HELOXY™ Modifier 68 from Momentive), diglycidyl ether of cyclohexanedimethanol (for example, HELOXY™ Modifier 107 from Momentive), trimethylol ethane triglycidyl ether (for example, HELOXY™ Modifier 44 from Momentive), trimethylol propane triglycidyl ether (for example, HELOXY™ Modifier 48 from Momentive), polyglycidyl ether of an aliphatic polyol (for example, HELOXY™ Modifier 84 from Momentive), polyglycol diepoxide (for example, HELOXY™ Modifier 32 from Momentive), bisphenol F epoxides (for example, EPN-1138 or GY-281 resin from Huntman Advanced Materials), and 9,9-bis>4-(2,3-epoxypropoxy)-phenyl fluorenone (for example, EPON™ 1079 resin from Momentive).

Still other useful epoxy materials are resins such as copolymers derived from acrylic acid esters reacted with glycidol such as glycidyl acrylate and glycidyl methacrylate, copolymerized with one or more ethylenically unsaturated polymerizable monomers. Examples of such copolymers are poly(styrene-co-glycidyl methacrylate) (50:50 molar ratio), poly(methyl methacrylate-co-glycidyl acrylate) (50:50 molar ratio), and poly(methyl methacrylate-co-ethyl acrylate-co-glycidyl methacrylate) (62.5:24:13.5 molar ratio).

One or more photopolymerizable epoxy materials can be included in the non-aqueous metal catalytic composition in a suitable amount to provide the desired efficient photocuring or photopolymerization. For example, the one or more photopolymerizable epoxy materials can be present in an amount of at least 10 weight % and up to and including 50 weight %, all based on the total amount of components (a) through (e) in the non-aqueous metal catalytic composition.

Various compounds can be used to generate a suitable acid to participate in the photocuring of the photopolymerizable epoxy materials described above. Some of these "photoacid generators" are acidic in nature and others are nonionic in nature. Other useful photoacid generators besides those described below would be readily apparent to one skilled in the art in view of the teaching provided herein. The various compounds useful as photoacid generators can be purchased from various commercial sources or prepared using known synthetic methods and starting materials.

Onium salt acid generators useful in the practice of this invention include but are not limited to, salts of diazonium, phosphonium, iodonium, or sulfonium salts including polyaryl diazonium, phosphonium, iodonium, and sulfonium salts. The iodonium or sulfonium salts include but not limited to, diaryliodonium and triarylsulfonium salts. Useful counter anions include but are not limited to complex metal halides, such as tetrafluoroborate, hexafluoroantimonate, trifluoromethanesulfonate, hexafluoroarsenate, hexafluorophosphate, and arenesulfonate. The onium salts can also be oligomeric or polymeric compounds having multiple onium salt moieties as well as molecules having a single onium salt moiety.

Useful iodonium salts can be simple salts (for example, containing an anion such as chloride, bromide, iodide, or $C_4H_5SO_3^-$) or a metal complex salt (for example, containing $SbF_6^-$, $PF_6^-$, $BF_4^-$, tetrakis(perfluorophenyl)borate, or $SbF_5OH_{31}AsF_6^-$). Mixtures of any of these iodonium salts of the same or different class can be used if desired.

The selection of a particular onium salt can be made for optimum properties with the other essential components and amounts. Particularly useful sulfonium salts include but are not limited to, triaryl-substituted salts such as mixed triarylsulfonium hexafluoroantimonates (for example, commercially available as UVI-6974 from Dow Chemical Company), mixed triarylsulfonium hexafluorophosphates (for example, commercially available as UVI-6990 from Dow Chemical Company), and arylsulfonium hexafluorophosphates.

One or more onium salts (such as an iodonium salt or a sulfonium salt) are generally present in the non-aqueous metal catalytic composition in an amount of at least 0.05 weight % and up to and including 10 weight %, or typically at least 0.1 weight % and up to and including 10 weight %, or even at least 0.5 weight % and up to and including 5 weight %, all based on the total amount of components (a) through (e) in the non-aqueous metal catalytic composition.

Besides onium salts described above, nonionic photoacid generators can be useful, which compounds include but are not limited to, diazomethane derivatives such as, glyoxime derivatives, bissulfone derivatives, disulfono derivatives, nitrobenzyl sulfonate derivatives, sulfonic acid ester derivatives, and sulfonic acid esters of N-hydroxyimides. One or more nonionic photoacid generators can be present in the non-aqueous metal catalytic composition in an amount of at least 0.05 weight % and up to and including 10 weight %, or typically at least 0.1 weight % and up to and including 10 weight %, or even at least 0.5 weight % and up to and including 5 weight %, all based on the total amount of components (a) through (e) in the non-aqueous metal catalytic composition.

For free radical photocuring chemistry, the photocurable component can be one or more free-radically polymerizable compounds to provide free-radically polymerizable functionality, including ethylenically unsaturated polymerizable monomers, oligomers, or polymers such as mono-functional or multi-functional acrylates (also includes methacrylates). Such free-radically polymerizable compounds comprise at least one ethylenically unsaturated polymerizable bond and they can comprise two or more of these unsaturated moieties in many embodiments. Suitable materials of this type contain at least one ethylenically unsaturated polymerizable bond and are capable of undergoing addition (or free radical) polymerization. Such free radically polymerizable materials include mono-, di-, or poly-acrylates and methacrylates, co-polymerizable mixtures of acrylate monomers and acrylate oligomers, and vinyl compounds such as styrene and styrene derivatives, diallyl phthalate, divinyl succinate, divinyl adipate, and divinyl phthalate. Mixtures of two or more of these free radically polymerizable materials can be used if desired. Such materials can be purchased from a number of commercial sources or prepared using known synthetic methods and starting materials.

The one or more free radically polymerizable materials can be present in the non-aqueous metal catalytic compositions in an amount of at least 20 weight % and up to and including 60 weight %, based on the total amount of components (a) through (e) in the non-aqueous metal catalytic composition.

The photocurable component can also include one or more free radical photoinitiators that are also present in the photopolymerizable compositions to generate free radicals in the presence of the free-radically polymerizable compounds. Such free radical photoinitiators include any compound that is capable of generating free radicals upon exposure to photocuring radiation used in the practice of this invention such as ultraviolet or visible radiation. For example, free radical photoinitiators can be selected from triazine compounds, thioxantone compounds, benzoin compounds, carbazole compounds, diketone compounds, sulfonium borate compounds, diazo compounds, and biimidazole compounds, benzophenone compounds, anthraquinone compounds, acetophenone compounds, and others that would be readily apparent to one skilled in the art. Mixtures of such compounds can be selected from the same or different classes. Many of such free radical photoinitiators can be obtained from various commercial sources.

Such free radical photoinitiators can be present in the non-aqueous metal catalytic composition in an amount of at least 0.1 weight % and up to and including 10 weight %, or typically at least 1 weight % and up to and including 5 weight %, all based on the total amount of components (a) through (e) in the non-aqueous metal catalytic composition.

Essential component (d) can be a non-curable polymer that acts as a binder material or if in liquid form, an organic solvent for the non-aqueous metal catalytic composition. Examples of such polymers include but are not limited to polyalkyl methacrylates, poly(vinyl acetate), polystyrene, poly(vinyl alcohol), polypropylene, poly(vinyl butyral) (for example, BUTVAR™ resin) and other polyvinyl acetals, and other polymers that would be readily apparent to one skilled in the art from this teaching. Useful polymers also include copolymers derived at least in part from vinyl alcohol or derivatives thereof.

Useful photosensitizers as essential component (e) can be present in the non-aqueous metal catalytic compositions, and such compounds are different from all of the other components in the non-aqueous metal catalytic composition. For example, for the acid catalyzed chemistry, an electron donor photosensitizer can be present. Useful electron donor photosensitizers should be soluble in the non-aqueous metal catalytic composition, free of functionalities that would substantially interfere with the photocuring process, and capable of light absorption (sensitivity) within the range of exposure wavelengths.

For example, each of the electron donor photosensitizers generally has an oxidation potential of at least 0.4 V and up to and including 3 V vs. SCE, or more typically of at least 0.8 V and up to and including 2 V vs. SCE.

In general, many different classes of compounds can be used as electron donor photo sensitizers including but are not limited to, aromatics such as naphthalene, 1-methylnaphthalene, anthracene, 9,10-dimethoxyanthracene, benz[a]anthracene, pyrene, phenanthrene, benzo[c]phenanthrene, and fluoranthene; thioxanthones and xanthones; ketones including aromatic ketones such as fluorenone, and coumarin dyes such as ketocoumarins such as those with strong electron donating moieties (such as dialkylamino). Other suitable electron donor photosensitizers include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriarylmethanes, merocyanines, squarylium dyes, and pyridinium dyes.

In some embodiments, the electron donor photosensitizer is a pyrene, benzopyrene, perylene, or benzoperylene.

In other embodiments, useful photo sensitizers include but are not limited to, ketocoumarins, xanthones, thioxanthones, arylketones, and polycyclic aromatic hydrocarbons in amounts described above.

The one or more electron donor photosensitizers can be present in the non-aqueous metal catalytic composition in an amount of at least 1 weight % and up to and including 5 weight %, and typically at least 1 weight % and up to and including 4 weight %, based on the total amount of essential components (a) through (e) in the non-aqueous metal catalytic composition.

The non-aqueous metal catalytic compositions are generally prepared for coating, printing, or other means of application by simply admixing, under "safe light" conditions, the essential components (a) through (e) and any optional components described herein. Such materials can be mixed and dispersed within suitable inert organic solvents to provide an inert organic solvent medium, which inert organic solvents do not react appreciably with any other components incorporated therein. Examples of suitable inert organic solvents include but are not limited to, acetone, dichloromethane, isopropanol, DOWANOL® PM solvent, ethylene glycol, and mixtures thereof. When one or more essential components (a) through (e) are in liquid form, those components can act as the "solvent" for the non-aqueous metal catalytic composition, or used in combination with one or more inert organic solvents. Inert organic solvent-free non-aqueous metal catalytic compositions can be prepared by simply dissolving, dispersing, and mixing the essential components (a) through (e) and any optional components with or without the use of mild heating to facilitate dissolution or dispersion.

When inert organic solvents are used, they can be present in the non-aqueous metal catalytic composition an amount of at least 1 weight % and up to and including 70 weight % or at least 20 weight % and up to and including 50 weight %, based on the total weight of the non-aqueous metal catalytic composition. The amount of inert organic solvents can be judiciously chosen depending upon the particular materials used, the means for applying the resulting non-aqueous metal catalytic composition, and desired properties including composition uniformity.

In some embodiments one or more of the photocurable components or non-curable polymers acts as an organic solvent medium and no additional inert organic solvents are purposely added to the non-aqueous metal catalytic composition.

The non-aqueous metal catalytic composition can further include carbon black, graphite, graphene, carbon nanotubes, or other sources of carbon if desired in an amount of at least 0.5 weight % based on the total weight of the essential components (a) through (e) described above.

It is also possible to include carbon-coated metal particles such as carbon-coated copper particles or carbon-coated silver particles in desirable amounts.

In some embodiments of this invention, the non-aqueous metal catalytic composition comprises:

(a) the silver complex comprising reducible silver ions, in an amount of at least 2 weight % and up to and including 90 weight %, (b) the oxyazinium salt silver ion photoreducing agent in an amount of at least 2 weight % and up to and including 10 weight %, (c) the hindered pyridine in an amount of at least 5 weight % and up to and including 20 weight %, (d) the photocurable component, non-curable polymer, or a combination of a photocurable component and a non-curable polymer, in an amount of at least 10 weight % and up to and including 88 weight %, and (e) the photo sensitizer is present in an amount of at least 1 weight % and up to and including 10 weight %, all amounts based on the total amount of components (a) through (e) in the non-aqueous metal catalytic composition.

Such non-aqueous metal catalytic compositions can also further comprise one or more inert organic solvents to provide an inert organic solvent medium.

Preparing Non-Aqueous Metal Catalytic Compositions

The essential components (a) through (e) described above and any optional components, with or without one or more inert organic solvents can be blended to prepare a non-aqueous metal catalytic composition under "safe light" conditions if desired. This mixing can occur in suitable inert organic solvents (as described above) if desired. The resulting non-aqueous metal catalytic composition can be provided in liquid form having a viscosity of at least 1 centipoise and up to and including 100,000 centipoises at 25° C., or it can be provided as a free flowing powder. The non-aqueous metal catalytic composition can be applied to a variety of substrates (described above) by conventional means and photocured to the tack-free state within 1 second or up to 10 minutes or more.

Examples of suitable inert organic solvents include but are not limited to, acetone, methanol, ethanol, isopropanol, 1-methoxy-2-propanol, methylene chloride, and any other inert organic solvent that does not react appreciably with any of the components of the non-aqueous metal catalytic compositions. Mixtures of inert organic solvents can also be used.

Alternatively, a photocurable component can be used as the solvent for mixing of the essential and any optional components, or such a liquid material can be used in combination with inert organic liquid(s). An inert organic solvent can be used also to aid in obtaining a liquid formulation with suitable viscosity for desired methods of application to a substrate such as various coating methods, ink jet inks, or other materials or operations, such as for printing with relief elements or flexographic printing plates. However, organic solvent-free non-aqueous metal catalytic compositions also can be prepared by simply dissolving or dispersing the essential and optional components in one of the components that is in liquid form, with or without mild heating.

The amounts of the various components for these formulations are described above for the non-aqueous metal catalytic compositions.

Photoreducing can be achieved by activating (irradiating) the non-aqueous metal catalytic composition to reduce the reducible silver ions and also optionally, to cause polymerization or curing of one or more photocurable components, for example in the presence of oxygen. This photoreduction can be achieved by exposure to radiant energy such as ultraviolet light as described above. Desirable photoreduction is desirably achieved using UV or visible irradiation having a wavelength of at least 150 nm to and including 700 nm and at intensity of at least 1 mJ/cm$^2$ and up to and including 1000 mJ/cm$^2$ or more typically of at least 1 mJ/cm$^2$ and up to and including 800 mJ/cm$^2$. More details of this process are provided below.

Use of Non-Aqueous Metal Catalytic Compositions

As noted above, the non-aqueous metal catalytic composition can be formed in a suitable manner (uniformly or patternwise) on one or more supporting sides of a suitable substrate to provide a precursor article comprising a metal catalytic layer or a metal catalytic pattern.

The non-aqueous metal catalytic composition can be photocured or photopolymerized using suitable radiation as described above including ultraviolet light or visible actinic light, or both to photoreduce the reducible silver ions to silver particles in a fashion corresponding to the formed metal catalytic layer or metal catalytic pattern. One or more suitable light sources can be used for the exposure process. Each precursor article can be exposed individually as a single element, or in alternative embodiments described below, a web (for example, a roll-to-roll continuous web) of multiple precursor articles in multiple portions of a continuous web of substrate can be exposed as the web is passed through exposure stations, or the exposure device is passed over the web. The same or different non-aqueous metal catalytic compositions can be applied (for example, printed) on both supporting sides of the substrate whether it is in the form of a single element or continuous web. In many embodiments, different conductive metal patterns can be formed on opposing supporting sides of the substrate (or continuous web).

More specifically, the non-aqueous metal catalytic composition can be applied in a uniform or pattern-wise manner to any suitable substrate using any means for application, such as dip coating, roll coating, hopper coating, spray coating, spin coating, ink jetting, photolithographic imprinting, "flexographic" printing using printing elements including flexographic printing members (such as flexographic printing plates and flexographic printing sleeves), lithographic printing using lithographic printing plates, and gravure or intaglio printing using appropriate printing members.

When the non-aqueous metal catalytic composition is uniformly applied to a suitable substrate, it can be "imaged" or selectively exposed (or patterned) with exposing radiation through a suitable photomask (masking element) having the desired pattern, to reduce the silver ions to silver particles (metal) in a corresponding imagewise fashion. Excess non-aqueous metal catalytic composition can be then appropriately removed using a suitable "developer" organic solvent medium. These features or steps can be carried out on both (opposing) supporting sides of the substrate.

Suitable substrates (also known as "receiver elements") can be composed of any suitable material as long as it does not inhibit the purpose of the non-aqueous metal catalytic composition. For example, substrates can be formed from materials including but are not limited to, polymeric films, metals, glasses (untreated or treated for example with tetrafluorocarbon plasma, hydrophobic fluorine, or a siloxane water-repellant material), silicon or ceramic wafers, fabrics, papers, and combinations thereof (such as laminates of various films, or laminates of papers and films) provided that a uniform layer or pattern of a non-aqueous metal catalytic composition can be formed thereon in a suitable manner and followed by irradiation on at least one supportive surface thereof. The substrate can be transparent or opaque, and rigid or flexible. The substrate can include one or more auxiliary polymeric or non-polymeric layers or one or more patterns of other materials before the non-aqueous metal catalytic composition is applied according to the present invention.

A supportive surface of the substrate can be treated for example with a primer layer or electrical or mechanical treatments (such as graining) to render that surface "receptive" to improve adhesion of the non-aqueous metal catalytic composition and resulting photocured metal catalytic layer or metal catalytic pattern. An adhesive layer can be disposed on the substrate and this adhesive layer can have various properties in response to stimuli (for example, it can be thermally activated, solvent activated, or chemically activated) and that serves to provide a receptive layer. Useful adhesive materials of this type are described for example in [0057] of U.S. Patent Application 2008/0233280 (Blanchet et al.).

In some embodiments, the substrate comprises a separate receptive layer as a receptive surface disposed on the supportive side of the substrate, which receptive layer and substrate can be composed of a material such as a suitable polymeric material that is highly receptive of the non-aqueous metal catalytic composition. Such receptive layer can have any suitable dry thickness of at least 0.05 μm when measured at 25° C.

The supportive sides of the substrate, especially polymeric substrates, can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.).

Suitable substrate materials for forming precursor articles of the present invention include but are not limited to, metallic films or foils, metallic films on polymer, glass, or ceramic supports, metallic films on electrically conductive film supports, semi-conducting organic or inorganic films, organic or inorganic dielectric films, or laminates of two or more layers of such materials. For example, useful substrates can include polymeric films such as poly(ethylene terephthalate) films, poly(ethylene naphthalate) films, polyimide films, polycarbonate films, polyacrylate films, polystyrene films, polyolefin films, and polyamide films, silicon and other ceramics, metal foils such as aluminum foils, cellulosic papers or resin-coated or glass-coated papers, glass or glass-containing composites, metals such as aluminum, tin, and copper, and metalized films. The substrate can also include one or more charge injection layers, charge transporting layers, and semi-conducting layers on which the non-aqueous metal catalytic composition pattern is formed.

Particularly useful substrates are polyesters films such as films of poly(ethylene terephthalate), polycarbonate, or poly (vinylidene chloride) films with or without surface-treatments as noted above, or coatings.

Useful substrates can have a desired dry thickness depending upon the eventual use of the article formed therefrom, for example its incorporation into various articles or optical or display devices. For example, the substrate dry thickness (including all treatments and auxiliary layers) can be at least 0.001 mm and up to and including 10 mm, and especially for polymeric films, the substrate dry thickness can be at least 0.008 mm and up to and including 0.2 mm.

The substrate used to prepare the articles described herein can be provided in various forms, such as for example, individual sheets in any size or shape, and continuous webs such as continuous webs of transparent substrates including transparent polyester substrates that are suitable for roll-to-roll operations. Such continuous webs can be divided or formed into individual first, second, and additional portions on one or both supportive sides that can be used to form the same or different photoreduced patterns from the same or different non-aqueous metal catalytic compositions.

After application of the non-aqueous metal catalytic composition, any inert organic solvents can be removed by drying or a pre-baking procedure that does not adversely affect the remaining components or prematurely cause curing. Useful drying conditions can be as low as room temperature for as little as 5 seconds and up to and including several hours depending upon the manufacturing process. In most processes, such as roll-to-roll processes described below, the drying conditions can be at high enough temperatures to remove at least 90% of the inert organic solvent within at least 1 second.

Any formed uniform metal catalytic layer can have a dry thickness of at least 0.1 µm and up to and including 10 µm, or typically at least 0.2 µm and up to and including 1 µm, and the optimal dry thickness can be tailored for the intended use of the resulting uniform photoreduced layer, which generally has about the same dry thickness as the uniform layer of the non-photoreduced non-aqueous metal catalytic composition. Such a uniform metal catalytic layer can be applied to both (opposing) supporting sides of the substrate, which uniform layers can have the same or different non-aqueous metal catalytic compositions or dry thickness.

Any applied pattern of the non-aqueous metal catalytic composition can comprise a grid of lines (or other shapes including circles or an irregular network) having an average thickness (or width) of at least 0.2 µm and up to and including 100 µm, or typically of at least 5 µm and up to and including 10 µm, and the optimal dry thickness (or width) can be tailored for the intended use of the resulting uniform photoreduced layer, which generally has about the same dry thickness (or width) as the grid lines of the non-photoreduced non-aqueous metal catalytic composition.

Thus, the present invention provides precursor articles comprising a substrate and uniform layers or patterns of the non-aqueous metal catalytic composition, wherein such precursor articles can be then appropriate exposed (for example as described above at a wavelength of at least 150 nm and up to and including 700 nm) to reduce silver ions to silver particles, for example in the presence of oxygen, to provide intermediate articles with metal catalytic layers or metal catalytic patterns.

For example, the photoreducing of the reducible silver ions to silver can provide particles having an average particle size of at least 10 nm and up to and including 1000 nm (or at least 20 nm and up to and including 500 nm) and at least 80% (or at least 90%) of the number of the silver particles have a particle size of at least 10 nm and up to and including 100 nm.

During exposure to reduce the silver ions, photocuring can be initiated with any photocurable components present in the metal catalytic layer or metal catalytic pattern, and the resulting silver particles can be surrounded in a photocured matrix derived from a photocurable component and other remaining components.

In some embodiments, the same or different non-aqueous metal catalytic composition can be applied in a suitable manner on both supporting sides (main surfaces) of the substrate to form "duplex" or dual-sided precursor articles, and each applied non-aqueous metal catalytic composition can be in the form of the same or different uniform metal catalytic layer or metal catalytic pattern.

In many embodiments, a metal catalytic pattern of the non-aqueous metal catalytic composition is applied on one or both (opposing) supporting sides of the substrate (for example as a roll-to-roll web) using a relief element such as elastomeric relief elements derived from flexographic printing plate precursors, many of which are known in the art and some are commercially available, for example as the CYREL® Flexographic Photopolymer Plates from DuPont and the Flexcel SR and NX Flexographic plates from Eastman Kodak Company.

Particularly useful elastomeric relief elements are derived from flexographic printing plate precursors and flexographic printing sleeve precursors, each of which can be appropriately imaged (and processed if needed) to provide the relief elements for "printing" or applying a suitable metal catalytic pattern.

For example, useful elastomeric relief elements can be comprised of one or more elastomeric layers, with or without a substrate, in which a relief image can be generated using suitable imaging means.

For example, the elastomeric relief element (for example, flexographic printing member) having a relief layer comprising an uppermost relief surface and an average relief image depth (pattern height) of at least 50 µm, or typically having an average relief image depth of at least 100 µm relative from the uppermost relief surface, can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of all of which are incorporated herein by reference for details of such flexographic printing member precursors. Such elastomeric photopolymerizable layers can be imaged through a suitable mask image to provide an elastomeric relief element (for example, flexographic printing plate or flexographic printing sleeve). In some embodiments, the relief layer comprising the relief pattern can be disposed on a suitable substrate. Other useful materials and image formation methods (including development) for provide elastomeric relief images are also described in the noted Ali et al. patent. The relief layer can be different if different patterns of non-aqueous metal catalytic compositions are applied to opposing supporting sides of the substrate.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529

(Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.), the disclosures of all of which are incorporated herein for details of such laser-engraveable precursors.

When the noted elastomeric relief elements are used in the present invention, the non-aqueous metal catalytic composition can applied in a suitable manner to the uppermost relief surface (raised surface) in the elastomeric relief element. Application to a substrate can be accomplished in a suitable procedure and it is desirable that as little as possible is coated onto the sides (slopes) or recesses of the relief depressions. Anilox roller systems or other roller application systems, especially low volume Anilox rollers, below 2.5 billion cubic micrometers per square inch (6.35 billion cubic micrometers per square centimeter) and associated skive knives can be used. Optimum metering of the non-aqueous metal catalytic composition onto the uppermost relief surface can be achieved by controlling viscosity or thickness, or choosing an appropriate application means.

For example, the non-aqueous metal catalytic composition can have a viscosity during this application of at least 1 cps (centipoise) and up to and including 5000 cps, or at least 1 cps to and up to and including 1500 cps. The thickness of the non-aqueous metal catalytic composition on the relief image is generally limited to a sufficient amount that can readily be transferred to a substrate but not too much to flow over the edges of the elastomeric relief element in the recesses during application.

The non-aqueous metal catalytic composition can be fed from an Anilox or other roller inking system in a measured amount for each printed precursor article. In one embodiment, a first roller can be used to transfer the non-aqueous metal catalytic composition from an "ink" pan or a metering system to a meter roller or Anilox roller. The non-aqueous metal catalytic composition is generally metered to a uniform thickness when it is transferred from the Anilox roller to a printing plate cylinder. When the substrate is moved through the roll-to-roll handling system from the printing plate cylinder to an impression cylinder, the impression cylinder applies pressure to the printing plate cylinder that transfers an image from an elastomeric relief element to the substrate.

After the non-aqueous metal catalytic composition has been applied to the uppermost relief surface (or raised surface) of the elastomeric relief element, it can be useful to remove at least 25 weight % of any inert organic solvents included therein to form a viscous deposit on the uppermost relief surface of the relief image. This removal of inert organic solvents can be achieved in any manner, for example using jets of hot air, evaporation at room temperature, or heating in an oven at an elevated temperature, or other means known in the art for removing a solvent.

Once on the substrate, either in a uniform metal catalytic layer or predetermined metal catalytic pattern of grid lines or other shapes (on one or opposing supporting sides of the substrate), the non-aqueous metal catalytic composition in the precursor article can be irradiated with suitable radiation as described above from a suitable source such as a fluorescent lamp or LED to provide a silver metal-containing and photocured metal catalytic layer or a silver metal-containing photocured metal catalytic pattern on the substrate. For example, silver ion reduction and any photocuring can be achieved by the use of UV-visible irradiation having a wavelength ($\lambda_{max}$) of at least 150 nm and up to and including 700 nm and at intensity of at least 1,000 microwatts/cm$^2$ and up to and including 80,000 microwatts/cm$^2$. The irradiation system used to generate such radiation can consist of one or more ultraviolet lamps for example in the form of 1 to 50 discharge lamps, for example, xenon, metallic halide, metallic arc (such as a low, medium or high pressure mercury vapor discharge lamps having the desired operating pressure from a few millimeters to about 10 atmospheres). The lamps can include envelopes capable of transmitting light of a wavelength of at least 150 nm and up to and including 700 nm or typically at least 240 nm and up to and including 450 nm. The lamp envelope can consist of quartz, such as spectrocil or Pyrex. Typical lamps that can be employed for providing ultraviolet radiation are, for example, medium pressure mercury arcs, such as the GE H3T7 arc and a Hanovia 450 W arc lamp. Silver ion photoreducing and any photocuring can be carried out using a combination of various lamps, some of or all of which can operate in an inert atmosphere. When using UV lamps, the irradiation flux impinging upon the substrate (or applied layer or pattern) can be at least 0.01 watts/inch$^2$ (0.0197 watts/cm$^2$) to effect sufficient rapid silver ion photoreduction and photocuring of the applied non-aqueous metal catalytic composition within 1 to 20 seconds in a continuous manner, for example in a roll-to-roll operation.

An LED irradiation device to be used in the photoreduction and photocuring can have an emission peak wavelength of 350 nm or more. The LED device can include two or more types of elements having different emission peak wavelengths greater than or equal to 350 nm. A commercial example of an LED device that has an emission peak wavelength of 350 nm or more and has an ultraviolet light-emitting diode (UV-LED), is NCCU-033 that is available from Nichia Corporation.

The result of such irradiation of a precursor article is an intermediate article comprising the substrate (for example, individual sheets or a continuous web) and having thereon either a photoreduced and photocured metal catalytic layer or a photoreduced or photocured metal catalytic pattern (containing suitable silver particles) on one or both supporting sides of the substrate, each of which is derived from a non-aqueous metal catalytic composition as described above.

The resulting intermediate articles can be used in this form for some applications, but in most embodiments, they are further processed to incorporate a conductive metal on the uniform photoreduced and photocured metal catalytic layer or photoreduced and cured metal catalytic pattern, each of which includes at least the silver metal particles as "seed" materials for further application of metals, such as using electroless metal procedures. For example, photoreduced and photocured metal catalytic layer or photoreduced and photocured metal catalytic pattern can include other "seed" metal particles besides the "seed" silver metal particles, including but not limited to, palladium, copper, nickel, and platinum particles, all of which particles can be electrolessly plated with copper, platinum, palladium, or other metals described below.

One useful method of this invention uses multiple flexographic printing plates (for example, prepared as described above) in a stack in a printing station wherein each stack has its own printing plate cylinder so that each flexographic printing plate is used to print individual substrates, or the stack of printing plates can be used to print multiple portions in a substrate web (on one or both opposing supporting sides). The same or different non-aqueous metal catalytic composition can be "printed" or applied to a substrate (on same or opposing supporting sides) using the multiple flexographic printing plates.

In other embodiments, a central impression cylinder can be used with a single impression cylinder mounted on a printing press frame. As the substrate (or receiver element) enters the printing press frame, it is brought into contact with the impression cylinder and the appropriate metal catalytic pattern is printed (formed) using the non-aqueous metal catalytic composition.

Alternatively, an in-line flexographic printing process can be utilized in which the printing stations are arranged in a horizontal line and are driven by a common line shaft. The printing stations can be coupled to exposure stations, cutting stations, folders, and other post-processing equipment. A skilled worker could be readily determined other useful configurations of equipment and stations using information that is available in the art. For example, an in-the-round imaging process is described in WO 2013/063084 (Jin et al.).

The intermediate article can be stored with just the metal catalytic layer or metal catalytic pattern comprising the silver particles for use at a later time.

The intermediate article described herein formed after photoreducing the reducible silver ions to silver particles, can be immediately immersed in an aqueous-based electroless metal plating bath or solution to electrolessly plate a suitable metal onto the silver particles in the metal catalytic layer or the metal catalytic pattern.

In other embodiments, after photoreducing the reducible silver ions to silver particles, surface coating is washed with an alcohol such as methanol, ethanol, isopropanol, or any other useful water-miscible organic solvent, or mixture thereof, and electroless plating can be carried out subsequently.

Thus, the intermediate article can be contacted with an electroless plating metal that is the same as or different from the "seed" silver metal particles described above. In most embodiments, the electroless plating metal is a metal different from silver metal particles.

Any metal that will likely electrolessly "plate" on the silver metal particles can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure to provide a conductive metal layer or a conductive metal pattern on one or more portions of one or opposing supporting sides of the substrate, the resulting product article can be removed from the aqueous-based electroless plating bath or solution and again washed using distilled water or deionized water or another aqueous-based solution to remove any residual electroless plating chemistry. At this point, the electrolessly plated metal is generally stable and can be used for its intended purpose.

In some embodiments, the resulting product article can be rinsed or cleaned with water at room temperature as described for example in [0048] of WO 2013/063183 (Petcavich), or with deionized water at a temperature of less than 70° C. as described in [0027] of WO 2013/169345 (Ramakrishnan et al.).

Thus, a method of this invention can be used to provide a product article comprising a substrate and having disposed thereon one or more electrically-conductive patterns (on either or both supporting sides) comprising electrically-conductive metals acquired by providing "seed" silver metal particles by in-situ reduction of silver ions followed by electroless plating with more silver or with a different metal.

To change the surface of the electrolessly plated metal for visual or durability reasons, it is possible that a variety of post-treatments can be employed including surface plating of still at least another (third or more) metal such as nickel or silver on the first electrolessly plated metal (this procedure is sometimes known as "capping"), or the creation of a metal oxide, metal sulfide, or a metal selenide layer that is adequate to change the surface color and scattering properties without reducing the electrical conductivity of any electrolessly plated metal. Depending upon the metals used in the various capping procedures, it may be desirable to treat the electrolessly plated metal with a seed metal catalyst in an aqueous-based seed metal catalyst solution to facilitate deposition of additional metals.

In addition, multiple treatments with the same or different aqueous-based electroless metal plating solution can be carried out in sequence, using the same or different conditions. Sequential washing or rinsing steps can be also carried out where appropriate at room temperature or a temperature less than 70° C.

In some embodiments, a method for providing an electrically-conductive product article comprises:

providing a continuous web of a transparent substrate of any of those materials described above, but particularly transparent polymeric substrates, providing a metal catalytic pattern on one or more portions of the continuous web using a non-aqueous metal catalytic composition as described above, for example applying it using a flexographic printing member, exposing the metal catalytic pattern to radiation (as described above) to reduce the silver ions (photoreduction) and optionally photocure photocurable components in the non-aqueous metal catalytic composition in the one or more portions of the continuous web, and electrolessly plating the non-aqueous metal catalytic composition in the one or more portions of the continuous web with an electrically conductive metal, using electroless plating procedures described above.

Embodiments of this method can be carried out on only one of the supporting sides of the transparent substrate, or on both supporting sides of the transparent substrate to provide the same or different electrically-conductive patterns of electrically conductive metals.

As would be apparent to one skilled in the art, a plurality of portions having the same or different electrically-conductive patterns can be provided on this continuous web (on one or both supporting sides) according to the present invention.

For example, a method for providing a plurality of product articles comprises:

providing a continuous web of a transparent substrate, forming a metal catalytic pattern on at least a first portion of the continuous web using a non-aqueous metal catalytic composition as described above, exposing the metal catalytic pattern to photoreducing radiation (as described above) to form silver metal particles in the first portion of the continuous web (which first portion can also contain photocured materials), electrolessly plating the silver metal particles in the first portion of the continuous web with an electrically conductive metal (as described above), and repeating these features on one or more additional portions of the continuous web that are different from the first portion, using the same or different non-aqueous metal catalytic composition.

The exposure to photoreducing radiation can be carried out by advancing the continuous web comprising the first portion comprising the metal catalytic pattern to be proximate exposing radiation, and thereby photoreducing the silver ions. Second and additional portions can be similarly advanced on the continuous web to be proximate exposing radiation to reduce the reducible silver ions in each of the portions. Electroless plating can be carried out immediately, of if desired, the resulting continuous web comprising multiple metal catalytic patterns with silver metal particles can be wound up as a roll for future use.

As would be apparent from other teaching in this disclosure, such method embodiments can be carried out on opposing supporting sides of the continuous web to provide same or different metal catalytic patterns.

The multiple electrically-conductive patterns provided by electrolessly plating the metal catalytic patterns can be used to form individual or multiple electrically conductive articles from the continuous web and such electrically-conductive articles can be assembled into the same or different individual devices.

Thus, useful product articles prepared according to the present invention can be formulated into capacitive touch screen sensors that comprise suitable electrically-conductive grid lines in touch regions, electrodes, electrical leads, and electrically-conductive connectors that provide connection of electrically-conductive grids with other components of a device.

Some details of useful methods and apparatus for carrying out these features are described for example in WO 2013/063183 (Petcavich), WO 2013/169345 (Ramakrishnan et al.). Other details of a useful manufacturing system for preparing electrically-conductive articles especially in a roll-to-roll manner are provided in PCT/US/062366, filed Oct. 29, 2012 by Petcavich and Jin, the disclosure of which is incorporated herein by reference.

An additional system of equipment and step features that can be used in carrying out the present invention is described in U.S. Patent Application Publication 2015/0191006 (U.S. application Ser. No. 14/146,867, filed Jan. 3, 2014 by Shifley), the disclosure of which is incorporated herein by reference for all details that are pertinent to the present invention.

The present invention provides at least the following embodiments and combinations thereof, but other combinations of features are considered to be within the present invention as a skilled artisan would appreciate from the teaching of this disclosure:

1. A non-aqueous metal catalytic composition comprising:
(a) a silver complex comprising reducible silver ions, in an amount of at least 2 weight %,
(b) an oxyazinium salt silver ion photoreducing agent in an amount of at least 2 weight %,
(c) a hindered pyridine in an amount of at least 5 weight %,
(d) a photocurable component, non-curable polymer, or combination of a photocurable component and a non-curable polymer, and
(e) a photosensitizer different from all components (a) through (d) in the non-aqueous metal catalytic composition, in an amount of at least 1 weight all amounts being based on the total amount of components (a) through (e) in the non-aqueous metal catalytic composition.

2. The non-aqueous metal catalytic composition of embodiment 1, further comprising an inert organic solvent.

3. The non-aqueous catalytic composition of any of embodiments 1 or 2, wherein the silver complex is silver nitrate, silver acetate, silver benzoate, silver nitrite, silver oxide, silver sulfate, silver thiocyanate, silver carbonate, silver myristate, silver citrate, silver phenylacetate, silver malonate, silver succinate, silver adipate, silver phosphate, silver perchlorate, silver tetrafluoroborate, silver acetylacetonate, silver lactate, silver oxalate, silver 2-phenylpyridine, and derivatives thereof. Other useful silver complexes include silver fluoride complexes such as silver (I) fluorosulfate, silver (I) trifluoroacetate, silver (I) trifluoromethane sulfate, silver (I) pentafluoropropionate, and silver (I) heptafluorobutyrate; β-carbonyl ketone silver (I) complexes, a silver protein, or a combination thereof.

4. The non-aqueous metal catalytic composition of any of embodiments 1 to 3, wherein the silver complex is present in an amount of at least 10 weight % and up to and including 25 weight %, based on the total amount of components (a) through (e).

5. The non-aqueous metal catalytic composition of any of embodiments 1 to 4, wherein the oxyazinium salt silver ion photoreducing agent is one or more of the oxyazinium salt compounds OZ-1 through OZ-16 in the following TABLE I:

TABLE I

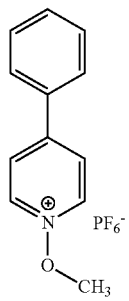

OZ-1

TABLE I-continued
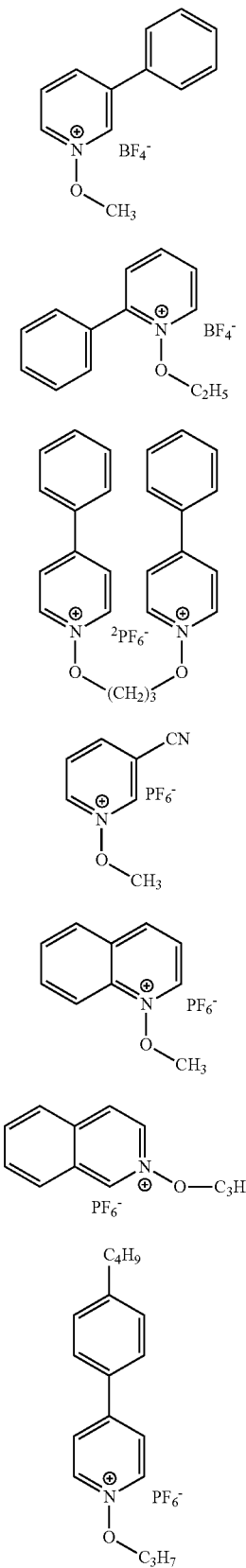
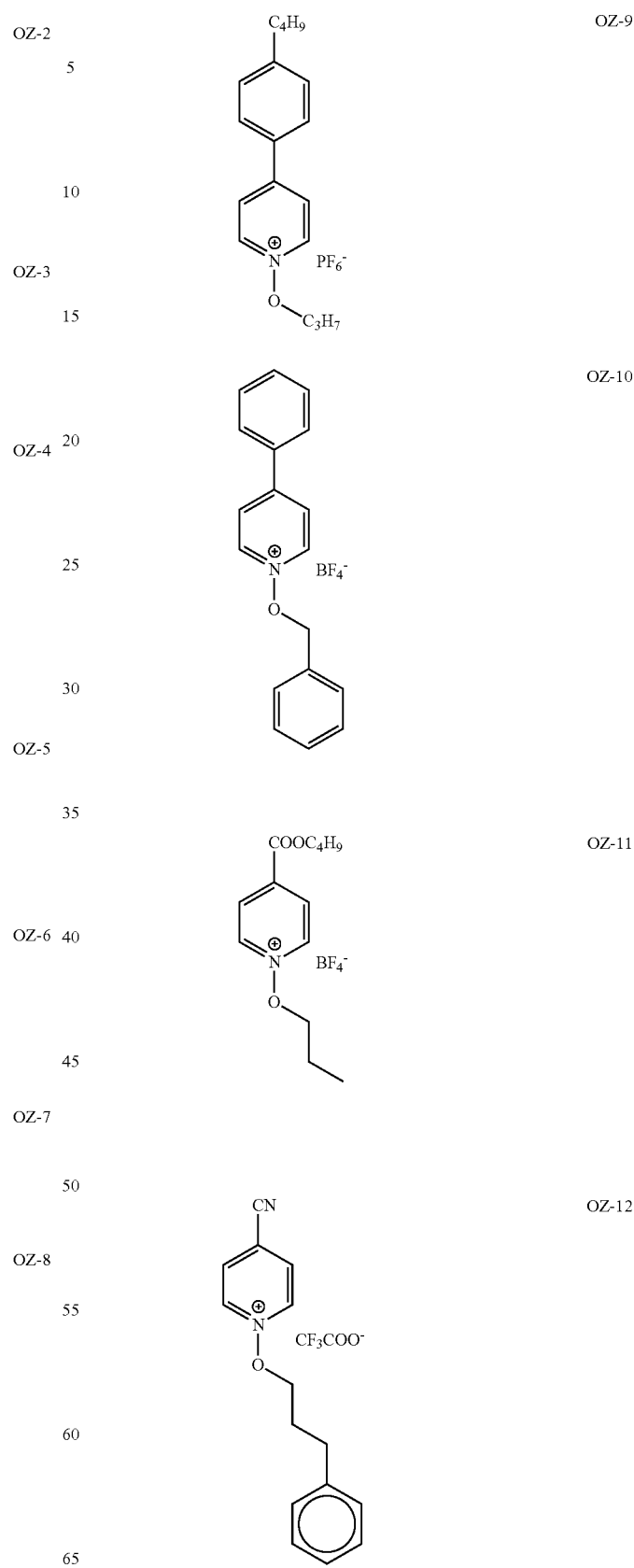

TABLE I-continued

OZ-13
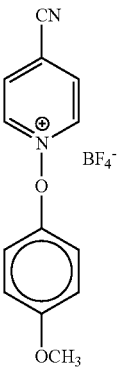

OZ-14
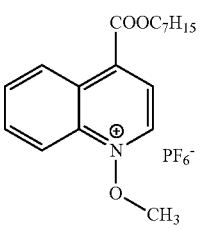

OZ-15
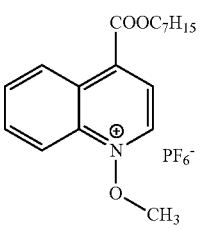

OZ-16
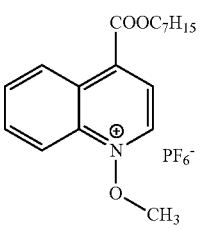

6. The non-aqueous metal catalytic composition of any of embodiments 1 to 5, wherein the photosensitizer is a ketocoumarin, xanthone, thioxanthone, arylketone, polycyclic aromatic hydrocarbon, or combination thereof.

7. The non-aqueous metal catalytic composition of any of embodiments 1 to 6, wherein the photocurable component or non-curable polymer acts as an organic solvent medium and no additional inert organic solvents are purposely added to the non-aqueous metal catalytic composition.

8. The non-aqueous metal catalytic composition of any of embodiments 1 to 7, wherein the oxyazinium salt silver ion photoreducing agent is present in an amount of at least 2 weight % and up to and including 25 weight %, based on the total amount of components (a) through (e).

9. The non-aqueous metal catalytic composition of any of embodiments 1 to 8, wherein the oxyazinium salt silver ion photoreducing agent is present in an amount of at least 2 weight % and up to and including 10 weight %, based on the total amount of components (a) through (e).

10. The non-aqueous metal catalytic composition of any of embodiments 1 to 9, wherein the hindered pyridine is present in an amount of at least 5 weight % and up to and including 20 weight %, based on the total amount of components (a) through (e).

11. The non-aqueous metal catalytic composition of any of embodiments 1 to 10, wherein the photocurable component, non-curable polymer, or combination of a photocurable component and a non-curable polymer is present in an amount of at least 10 weight % and up to and including 88 weight %, based on the total amount of components (a) through (e).

12. The non-aqueous metal catalytic composition of any of embodiments 1 to 11, wherein the photocurable component, non-curable polymer, or combination of a photocurable component and a non-curable polymer is present in an amount of at least 10 weight % and up to and including 50 weight %, based on the total amount of components (a) through (e).

13. The non-aqueous metal catalytic composition of any of embodiments 1 to 12, wherein the photosensitizer is an electron donor photosensitizer that is present in an amount of at least 1 weight % and up to and including 5 weight %, based on the total amount of components (a) through (e).

14. The non-aqueous metal catalytic composition of any of embodiments 1 to 13, further comprising an inert organic solvent in an amount of at least 20 weight % and up to and including 50 weight %, based on the total weight of the non-aqueous metal catalytic composition.

15. The non-aqueous metal catalytic composition of any of embodiments 1 to 14, further comprising carbon black, graphite, graphene, or carbon nanotubes.

16. The non-aqueous metal catalytic composition of any of embodiments 1 to 15, further comprising carbon-coated metal particles.

17. The non-aqueous metal catalytic composition of any of embodiments 1 to 16, comprising:

(a) the silver complex comprising reducible silver ions, present in an amount of at least 2 weight % and up to and including 90 weight %, (b) the oxyazinium salt silver ion photoreducing agent in an amount of at least 2 weight % and up to and including 10 weight %, (c) the hindered pyridine present in an amount of at least 5 weight % and up to and including 20 weight %, (d) the photocurable component, non-curable polymer, or combination of a photocurable component and non-curable polymer, present in an amount of at least 10 weight % and up to and including 88 weight %, and (e) the photo sensitizer present in an amount of at least 1 weight % and up to and including 10 weight %, all amounts based on the total amount of components (a) through (e) in the non-aqueous metal catalytic composition.

The following Examples are provided to illustrate the practice of this invention and are not meant to be limiting in any manner.

Preparation of a Comparative Composition Containing Silver Nitrate:

To a mixture of ethoxylated diacrylate (0.5 g, SR259 from Sartomer) and ethoxylated pentaerythritol tetraacrylate (0.167 g, SR 494 from Sartomer), photoinitiator and photoreducing agent 2-methyl-1-[4-(methylthio)phenyl]-2-(4-morpholinyl)-1-propanone (0.02 g, S9) was added and dissolved at room temperature by sonication in an ultrasound bath. To this mixture, a silver nitrate solution (0.4 ml, 0.67 g) was added and dissolved by stirring in the dark. In two hours, the viscosity of the formulation significantly increased and in the next 2-3 hours, the formulation gelled completely.

Inventive Example 1

This example demonstrates the use of a non-aqueous metal catalytic composition comprising a silver complex and an oxyazinium salt silver ion photoreducing agent for the generation of silver particles.

To a mixture of 1,1,1-trimethylolpropane triacrylate (1.66 g, SR351, Sartomer) and ethoxylated (30) bisphenol A dimethacrylate (3.33 g, SR 9036A, Sartomer), photoinitiator and silver ion photoreducing composition 4-phenyl-N-methoxypyridinium tetrafluoroborate (0.4 g, ~6 weight %), photosensitizer 2-chlorothixanthone (1 weight %), and hindered pyridine 2-phenylpyridine (2-4 weight %) were added and dissolved at room temperature in an ultrasound bath. To this mixture, the Ag(2-phenylpyridine)$_2^+$.NO$_3^-$ complex described above (1 g, ~10 weight %) dissolved in chloroform (0.7 ml) was added and dissolved by stirring in the dark to form a non-aqueous metal catalytic composition according to this invention.

This non-aqueous metal catalytic composition was spin coated onto poly(ethylene terephthalate) film substrates at 1500 rpm for 30 seconds to form precursor articles that were then exposed to UV light from a medium pressure Hg/Xe lamp for varying lengths of time to form intermediate articles. During exposure, the coatings changed color from colorless to yellow. An absorption spectrum of each coating was recorded, showing a clear plasmonic band at 420 nm due to formation of silver particles as shown in FIG. 1.

Electroless Copper Plating:

Each intermediate article described above was immersed in an electroless copper plating bath solution from ENTHONE® (Enplate LDS CU-406 SC) at 45° C. for 15 minutes using conditions recommended by the commercial supplier to provide product articles. Each product article was taken out of the bath, rinsed with water, and dried. A clear coating of metallic copper was observed on the surface of the product article.

Inventive Example 2

This example demonstrates the flexographic printing and electroless copper plating of a non-aqueous metal catalytic composition comprising a silver complex and an oxyazinium salt silver ion photoreducing composition for in-situ generation of silver particles.

Fine lines of nominal width 7-10 μm of the non-aqueous metal catalytic composition described in Invention Example 1 were printed on poly(ethylene terephthalate) film substrate to provide a precursor article. Printing of the fine lines was carried out using a flexographic IGT F1 printer and a flexographic printing member obtained from a commercially available Kodak Flexcel NX photopolymer plate. The applied pattern of non-aqueous metal catalytic composition was imaged through a mask that was written using the Kodak Square Spot laser technology at a resolution of 12,800 dpi. Exposure was carried out using with UV light using Fusion benchtop conveyor unit equipped with H-bulb. The nominal UV dose was between 50-100 mJ/cm$^2$.

Figure 2:
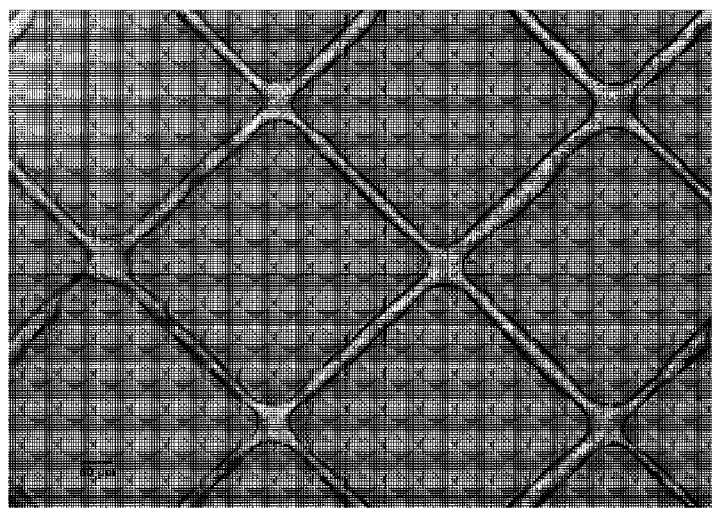
FIG. 2 is a micrograph of an article prepared according to the present invention in Invention Example 2 below.

After UV exposure, the resulting intermediate article was immersed in an electroless copper plating bath solution, ENTHONE® Enplate LDS CU-406 SC, at 45° C. for 15 minutes using conditions recommended by the commercial supplier. The resulting product article was taken out of the bath, rinsed with water, and dried. Micrographs of the printed electrically-conductive pattern showed a clear coating of metallic copper in printed lines (see FIG. 2).

The invention has been described in detail with particular reference to certain preferred embodiments thereof, but it will be understood that variations and modifications can be effected within the spirit and scope of the invention.

The invention claimed is:

1. A non-aqueous metal catalytic composition comprising, in admixture:

(a) a silver complex comprising reducible silver ions, in an amount of at least 2 weight % and up to and including 25 weight %, wherein the silver complex is silver acetate, silver benzoate, nitrite, silver oxide, silver thiocyanate, silver carbonate, silver myristate, silver citrate, silver phenylacetate, silver malonate, silver succinate, silver adipate, silver phosphate, silver perchlorate, silver tetrafluoroborate, silver acetyl acetonate, silver lactate, silver oxalate, silver 2-phenylpyridine; a fluoride complex; a β-carbonyl ketone silver(I) complex; a silver protein; or a combination thereof, (b) an oxyazinium salt silver on photoreducing agent in an amount of at least 2 weight % and up to and including 10 weight %, which oxyazinium salt photoreducing agent has a reduction potential less negative than −1.4 V and comprises an N-oxy group that is capable of releasing an oxy radical during irradiation of the non-aqueous metal catalytic composition, (c) a hindered pyridine in an amount of at least 5 weight % and up to and including 20 weight %, which hindered pyridine is selected from 2,6-dimethylpyridine, 2-tert-butylpyridine, and 2-phenylpyridine, (d) a photocurable component, non-curable polymer, or combination of a photocurable component and a non-curable polymer in an amount of at least 10 weight % and up to and including 88 weight %, and (e) a photo sensitizer different from ail components (a) through (d) in the non-aqueous metal catalytic composition, in an amount of at least 1 weight % and up to and including 5 weight %, all amounts being based on the total amount of components (a) through (e) in the non-aqueous metal catalytic composition.

2. The non-aqueous metal catalytic composition of claim 1, further comprising an inert organic solvent that does not react with any of components (a) through (e) and is selected from acetone, dichloromethane, isopropanol, propylene glycol methyl ether, chloroform, ethylene glycol, and mixtures thereof.

3. The non-aqueous meta catalytic composition of claim 1, wherein the oxyazinium salt photoreducing agent is one or more of the oxyazinium salt compounds OZ-1 through OZ-16 in the following TABLE I:

TABLE I
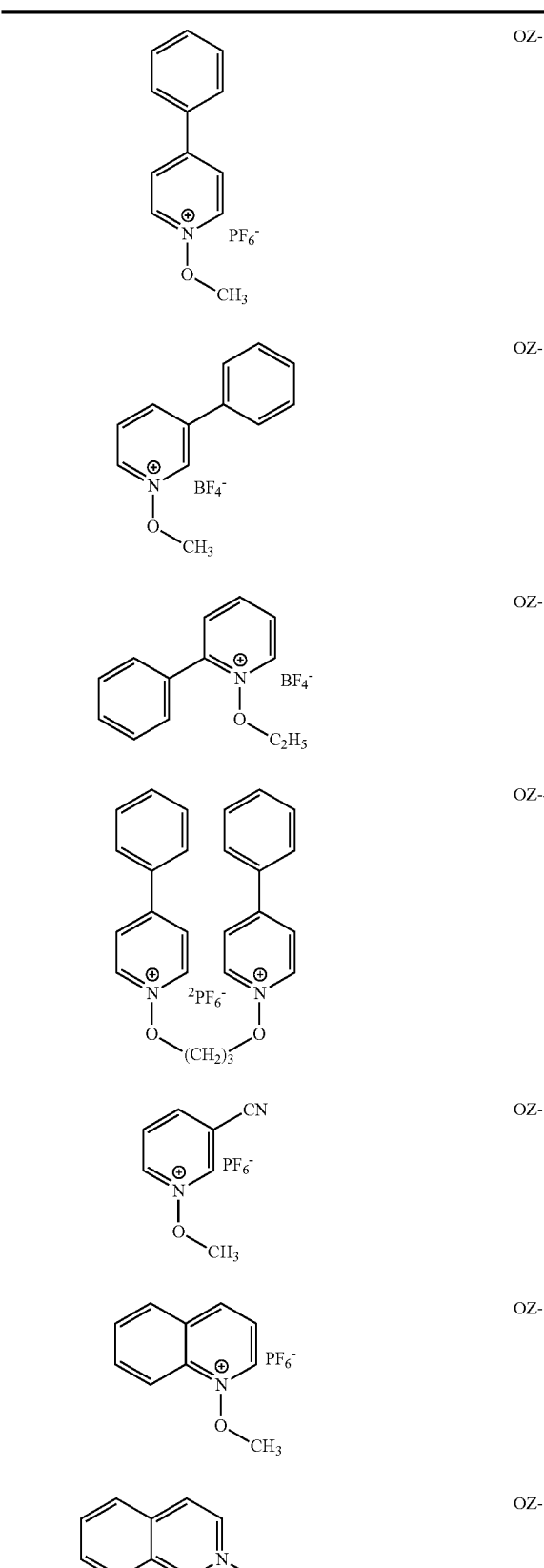
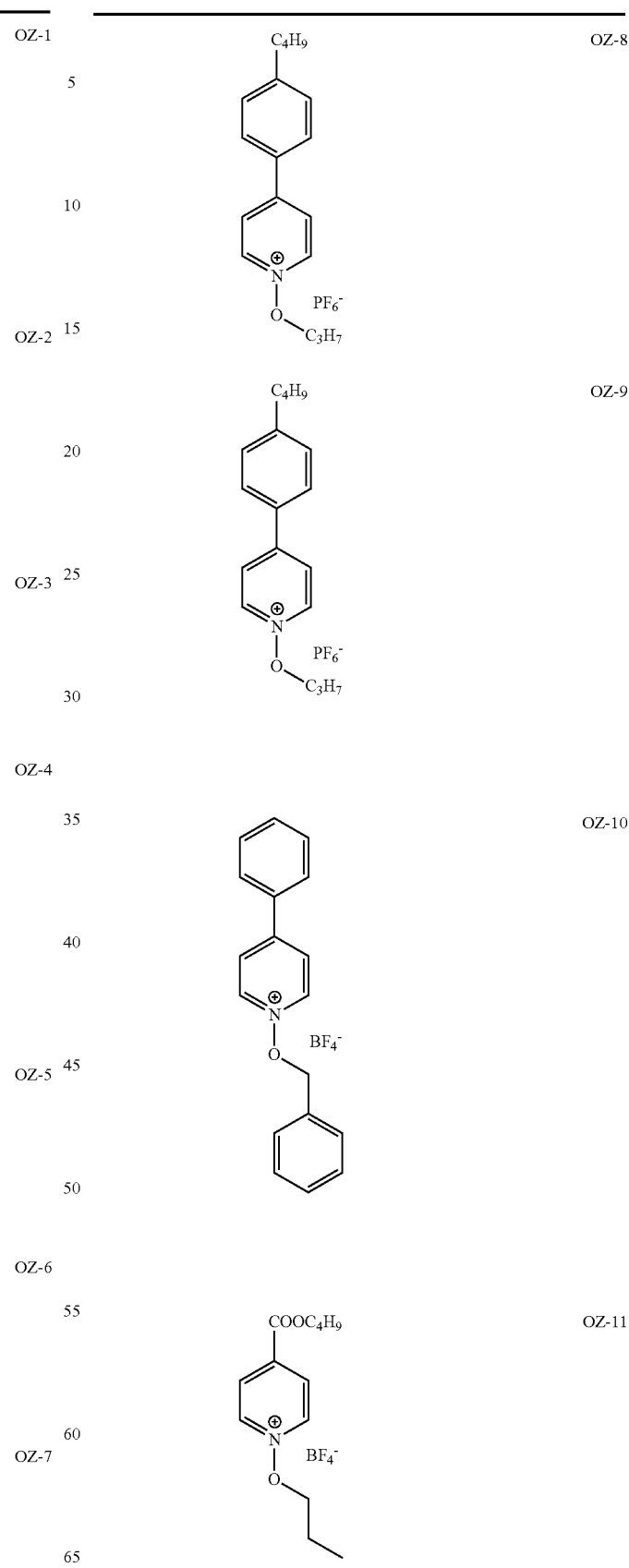

TABLE I-continued

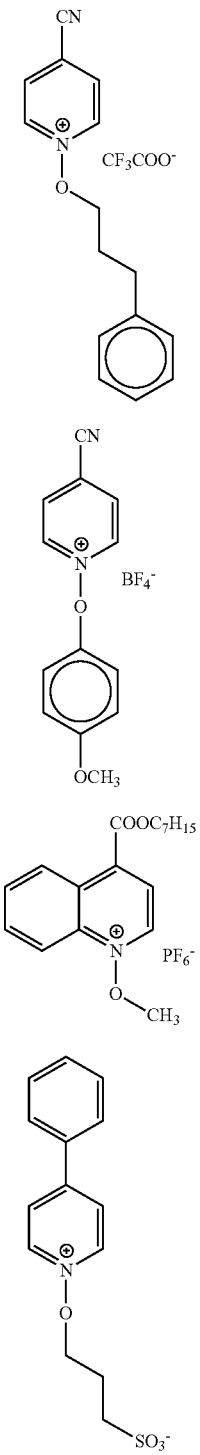

OZ-12

OZ-13

OZ-14

OZ-15

TABLE I-continued

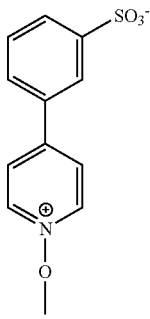

OZ-16

4. The non-aqueous metal catalytic composition of claim 1, wherein the photosensitizes is a ketocoumarin, xanthone, thioxanthone, arylketone, polycyclic aromatic hydrocarbon, or combination thereof.

5. The non-aqueous metal catalytic composition of claim 1, wherein the photocurable component or non-curable polymer acts as an organic solvent medium and no additional inert organic solvents are purposely added to the non-aqueous metal catalytic composition, which inert organic solvents do not react with any of components (a) through (e).

6. The non-aqueous metal catalytic composition of claim 1, wherein the photocurable component, non-curable polymer, or combination of a photocurable component and a non-curable polymer is present in an amount of at least 10 weight % and up to and including 50 weight %, based on the total amount of components (a) through (e).

7. The non-aqueous metal catalytic composition of claim 1, further comprising an inert organic solvent in an amount of at least 20 weight % and up to and including 50 weight %, based on the total weight of the non-aqueous metal catalytic composition, wherein the inert organic solvent does not react with any of components (a) through (e) and is selected from acetone, dichloromethane, isopropanol, dipropylene glylcol methyl ether, chloroform, ethylene glycol, and mixtures thereof.

8. The non-aqueous metal catalytic composition of claim 1, further comprising carbon black, graphite, graphene, or carbon nanotubes.

9. The non-aqueous metal catalytic composition of claim 1, further comprising carbon-coated metal particles that are carbon-coated silver particles or carbon-coated copper particles.

10. The non-aqueous metal catalytic composition of claim 1, comprising one or more silver complexes in an amount of at least 10 weight % and up to and including 25 weight %, based on the total amount of components (a) through (e) in the non-aqueous metal catalytic composition.

* * * * *